United States Patent
Yamazaki et al.

(10) Patent No.: US 7,481,889 B2
(45) Date of Patent: Jan. 27, 2009

(54) FILM FORMING APPARATUS AND FILM FORMING METHOD

(75) Inventors: Shunpei Yamazaki, Tokyo (JP); Takeshi Nishi, Kanagawa (JP)

(73) Assignee: Semiconductor Energy Laboratory Co., Ltd., Atsugi-Shi, Kanagawa-Ken (JP)

( * ) Notice: Subject to any disclaimer, the term of this patent is extended or adjusted under 35 U.S.C. 154(b) by 218 days.

(21) Appl. No.: 11/176,658

(22) Filed: Jul. 8, 2005

(65) Prior Publication Data

US 2005/0268854 A1    Dec. 8, 2005

Related U.S. Application Data

(62) Division of application No. 10/092,732, filed on Mar. 8, 2002, now Pat. No. 6,946,406.

(30) Foreign Application Priority Data

Mar. 12, 2001  (JP)  ............................. 2001-069422

(51) Int. Cl.
  C23C 16/00   (2006.01)
  C23C 16/448  (2006.01)
  C23C 14/24   (2006.01)
  C23C 14/26   (2006.01)
  C23C 14/56   (2006.01)

(52) U.S. Cl. .................. 118/726; 118/715; 118/719; 118/723 VE

(58) Field of Classification Search .................. 156/345.31–345.32; 118/719, 715, 723 VE, 723 EB, 118/726; 414/935–939
See application file for complete search history.

(56) References Cited

U.S. PATENT DOCUMENTS

| 3,563,202 | A | * | 2/1971 | Mackrael et al. | ............ 118/718 |
| 4,406,252 | A | * | 9/1983 | Jones | .......................... 118/724 |
| 4,449,037 | A | * | 5/1984 | Shibamata et al. | .......... 219/388 |
| 4,951,601 | A |   | 8/1990 | Maydan et al. | |

(Continued)

FOREIGN PATENT DOCUMENTS

EP    1035576 A2 *  9/2000

(Continued)

OTHER PUBLICATIONS

G.J. Sloan; "Automatic Zone Refiner for Organic Compounds"; *The Review of Scientific Instruments*, vol. 34, No. 1; pp. 60-62; Jan. 1963.

(Continued)

Primary Examiner—Jeffrie R Lund
(74) Attorney, Agent, or Firm—Fish & Richardson P.C.

(57) ABSTRACT

To provide a film forming apparatus in which an impurity contained in an organic compound is separated to be removed and a film is formed without decreasing the purity of the purified organic compound, whereby a high-purity organic compound is formed. A film forming apparatus of the present invention includes a purifying chamber for purifying an organic compound and a film forming chamber for vapor-depositing the purified organic compound onto a substrate. The organic compound purified by a zone melting method in the purifying chamber can be vapor-deposited onto the substrate provided in the film forming chamber without decreasing the purity thereof, so that a high-purity organic compound layer can be formed.

7 Claims, 11 Drawing Sheets

U.S. PATENT DOCUMENTS

| | | | |
|---|---|---|---|
| 5,277,933 A * | 1/1994 | Claar et al. | 427/248.1 |
| 5,302,208 A * | 4/1994 | Grimm et al. | 118/718 |
| 5,674,562 A * | 10/1997 | Claar et al. | 427/248.1 |
| 5,855,955 A * | 1/1999 | Claar et al. | 427/248.1 |
| 5,904,961 A | 5/1999 | Tang et al. | |
| 5,930,324 A * | 7/1999 | Matsui et al. | 378/34 |
| 6,113,982 A * | 9/2000 | Claar et al. | 427/248.1 |
| 6,123,764 A * | 9/2000 | Mizugaki et al. | 117/68 |
| 6,132,280 A * | 10/2000 | Tanabe et al. | 445/58 |
| 6,179,923 B1 * | 1/2001 | Yamamoto et al. | 118/719 |
| 6,270,839 B1 * | 8/2001 | Onoe et al. | 427/248.1 |
| 6,776,880 B1 * | 8/2004 | Yamazaki | 204/192.15 |
| 6,946,406 B2 * | 9/2005 | Yamazaki et al. | 438/781 |
| 7,195,801 B2 * | 3/2007 | Murakami et al. | 427/585 |
| 7,378,133 B2 * | 5/2008 | Yamazaki et al. | 427/561 |
| 2001/0006827 A1 * | 7/2001 | Yamazaki et al. | 438/30 |
| 2002/0132047 A1 * | 9/2002 | Yamazaki et al. | 427/255.6 |
| 2003/0146439 A1 * | 8/2003 | Yamazaki et al. | 257/79 |
| 2004/0113548 A1 * | 6/2004 | Yamazaki et al. | 313/506 |
| 2004/0139914 A1 * | 7/2004 | Yamazaki et al. | 118/719 |
| 2005/0224803 A1 * | 10/2005 | Yamazaki et al. | 257/72 |
| 2005/0268854 A1 * | 12/2005 | Yamazaki et al. | 118/726 |
| 2006/0141645 A1 * | 6/2006 | Yamazaki et al. | 438/22 |
| 2007/0221131 A1 * | 9/2007 | Yoshikawa et al. | 118/726 |

FOREIGN PATENT DOCUMENTS

| | | |
|---|---|---|
| EP | 1071117 A2 * | 1/2001 |
| EP | 1 087 448 | 3/2001 |
| JP | 09256142 A * | 9/1997 |

OTHER PUBLICATIONS

Y. Lupien et al.; "Preparation of High-Purity Anthracene: Zone Refining and the Triplet Lifetime"; *Molecular Crystals*, vol. 5, pp. 1-7; 1968.

* cited by examiner

FILM FORMING APPARATUS AND FILM FORMING METHOD

CROSS-REFERENCE TO RELATED APPLICATIONS

This application is a divisional application of U.S. application Ser. No. 10/092,732, filed Mar. 8, 2002, now U.S. Pat. No. 6,946,406 which claims the benefit of a foreign priority application filed in Japan as Serial No. 2001-069422 on Mar. 12, 2001. This application claims priority to each of these prior applications, and the disclosures of the prior applications are considered part of (and are incorporated by reference in) the disclosure of this application.

BACKGROUND OF THE INVENTION

1. Field of the Invention

The present invention relates to a film forming apparatus and a film forming method used for producing a light-emitting element including a film (hereinafter, referred to as an "organic compound layer") containing an organic compound that emits light by the application with an electric field, an anode, and a cathode. In particular, the present invention relates to production of a light-emitting element that is more unlikely to be degraded and has a longer life as compared with the conventional example.

2. Description of the Related Art

In recent years, a light-emitting apparatus having an organic light-emitting element as a self-luminous element is being actively studied. In particular, a light-emitting apparatus using an organic compound as a light-emitting material is drawing attention. Such a light-emitting apparatus is called an organic electroluminescence display (OELD) or an organic light-emitting diode (OLED).

A light-emitting element includes a layer (hereinafter, referred to as an "organic compound layer") containing an organic compound in which electroluminescence occurs by the application with an electric field, an anode, and a cathode. Luminescence in an organic compound includes fluorescence that occurs when an energy level returns from a singlet excited state to a ground state and phosphorescence that occurs when an energy level returns from a triplet excited state to a ground state. A light-emitting apparatus produced by the film forming apparatus and film forming method of the present invention is applicable to both the case using fluorescence and the case using phosphorescence.

Unlike a liquid crystal display apparatus, a light-emitting apparatus is of a self-luminous type, so that it has no problem of a viewing angle. More specifically, a light-emitting apparatus is more suitable as a display used outside, compared with a liquid crystal display. Thus, the use of a light-emitting apparatus in various forms has been proposed.

A light-emitting element has a structure in which an organic compound layer is interposed between a pair of electrodes, and the organic compound layer generally has a laminate structure. A typical example includes a laminate structure: "hole transport layer/light-emitting layer/electron transport layer" proposed by Tang et al. of Eastman Kodak Co. This structure has a very high light-emitting efficiency, and most of the light-emitting apparatuses that are being developed have this structure.

The following structures may also be used: "hole injection layer/hole transport layer/light-emitting layer/electron transport layer, which are stacked in this order on an anode", and "hole injection layer/hole transport layer/light-emitting layer/electron transport layer/electron injection layer, which are stacked in this order on an anode". A light-emitting layer may be doped with a fluorescent coloring matter or the like. Furthermore, these layers may be formed only of low-molecular weight materials, or may be formed only of high-molecular weight materials.

In the present specification, all the layers provided between a cathode and an anode are collectively called an organic compound layer. Therefore, the above-mentioned hole injection layer, hole transport layer, light-emitting layer, electron transport layer, and electron injection layer are all included in the organic compound layer. Furthermore, an element composed of a cathode, an organic compound layer, and an anode is called a light-emitting element. The light-emitting element has two kinds: a simple matrix system and an active matrix system. According to the simple matrix system, an organic compound layer is formed between two kinds of stripe-shaped electrodes provided so as to be orthogonal to each other. According to the active matrix system, an organic compound layer is formed between pixel electrodes arranged in a matrix so as to be connected to TFTs and a counter electrode.

The most serious problem of practical use of these light-emitting elements lies in that the element's life is insufficient. Degradation of an element is exhibited in such a manner that a non-light emitting region (dark spot) spreads along with light-emission for a long period of time. This is caused by degradation of an organic compound layer.

An organic compound constituting an organic compound layer is degraded by impurities such as oxygen and water. Furthermore, inclusion of impurities of an organic material and an inorganic material in an organic compound may cause an organic compound layer to be degraded.

Conventionally, when a film is formed by evaporation, an organic compound that is an evaporation material is used as it is. However, there is a problem that an impurity is mixed in an organic compound by the time when the organic compound is provided at an evaporation source. Furthermore, in order to prolong the life of an element, an organic compound with a much higher purity is required.

As a purifying method of an organic compound, a zone melding technique is known. This technique is suitable for enhancing the purity of a reagent and concentrating a trace amount of impurity material. In principle, this technique utilizes the fact that when a melted material is subjected to normal freezing, there is a distribution (segregation) in its purity. More specifically, as shown in FIG. 10, a bar-shaped solid sample 1001 is melted into a band-shaped melted portion (melted zone) 1003 by a heater 1002, and the heater 1002 is moved slowly from one end of the sample to the other end, thereby purifying the sample.

Along with the movement of the heater 1002, liquid is frozen on the backward side (region a: 1004) of the melted zone, and a solid is melted on the forward side (region b: 1005). At this time, the concentration of an impurity is different between the solid portion and the liquid portion, which is used for purification.

FIG. 11 shows a portion close to A in a binary phase diagram of a solid solution containing a component A and an impurity component B (a portion close to the left end of the phase diagram corresponds to a sample melted into a band shape since the sample is substantially pure). A solid of an impurity (concentration $C_{SO}$) starts precipitating at a solidification starting temperature $T_F$. A concentration ratio represented by $C_s/C_l$ is referred to as an equilibrium distribution coefficient $K_D$, and $K=C_s/C_o$ is referred to as an effective distribution coefficient. At the beginning of solidification, $C_1=C_0$, so that $K_D=K$. Actually, a concentration polarization occurs at an interface of a phase I (1006), a phase II (1003), and a phase III (1007), that is, a region a (1004) and a region b (1005), whereby K takes a value between 1 and $K_D$.

In FIG. 11A, $K_D$ is 1 or less. However, in FIG. 11B, $K_D$ becomes 1 or more. Thus, the concentration of an impurity in a liquid or a solid increases. At a time of $K_D=1$, a purification effect is not exhibited any more.

In other words, when $K_D$ is less than 1, a solid portion has a high purity. When $K_D$ is more than 1, a liquid portion has a high purity.

The purity of an organic compound can be enhanced by further purifying it before evaporation by utilizing the above-mentioned principle. However, even if an organic compound is purified, the purity thereof may be lowered before the organic compound is provided at an evaporation source in a film forming chamber.

SUMMARY OF THE INVENTION

Therefore, with the foregoing in mind, it is an object of the present invention to provide a film forming apparatus in which, in a purifying chamber, an organic compound is purified just before forming films, an impurity contained in the organic compound is separated to be removed, and film formation is conducted without decreasing the purity of the purified organic compound, whereby an organic compound layer with a high purity can be formed. It is another object of the present invention to provide a film forming method using the film forming apparatus of the present invention.

In order to solve the above-mentioned problems, the film forming apparatus of the present invention includes a purifying chamber for purifying an organic compound and a film forming chamber for evaporation the purified organic compound onto a substrate, in which the organic compound purified in the purifying chamber is evaporated onto a substrate provided in the film forming chamber without decreasing the purity of the organic compound.

A crucible including a solid organic compound is provided in the purifying chamber, and heated by a heater to form a melted zone. The melted zone used in the present specification refers to a region in which an organic compound is changed from a solid to a liquid by heating with a heater. In this specification, a crucible is taught as a container for holding an organic compound in the zone melting method. It is desirable that the container is made of a transparent material such as quartz and glass (heat-resistant hard glass mainly containing silicon dioxide and boron oxide) because the state of the melted zone to be formed can be observed. However, any known material withstanding a temperature at which an organic compound is melted or sublimated, such as synthetic resin (e.g., polytetrafluoroethylene and poly (difluoromethylene)), stainless steel, and metal, can be used. The heater is provided with a moving member. When the heater moves in a longitudinal direction of the crucible, the melted zone simultaneously moves in the crucible to be formed.

The region in which a melted zone has been formed among the organic compound in the crucible is changed to a solid when it is not heated any more due to the movement of the heater. At this time, an impurity may be brought in a melted zone (K<1) or an impurity is brought in a solid (K>1). In the former case, an impurity moves together with the movement of the melted zone, and an impurity contained in regions through which the melted zone has moved is collected in the melted zone. In the latter case, when the melted zone is changed to a solid, an impurity contained in the melted zone precipitates an impurity together with the solid, so that the impurity is removed from the melted zone.

More specifically, in the case of K<1, the region that becomes a melted zone once and is changed to a solid is highly purified. In the case of K>1, the resultant melted zone is highly purified.

Instead of moving the position where a crucible is heated by moving a heater, it may also be possible to adopt a structure in which a heater is fixed and a crucible is moved.

According to the above-mentioned purification of an organic compound, the purity of the organic compound can be further enhanced by repeating the purification. It may be possible that a plurality of heaters are provided, whereby a change in state between a melted zone and a solid is repeated a plurality of times in one region.

As described above, the organic compound highly purified in the purifying chamber is used as a vaporization material. According to the present invention, there is a method in which a highly purified organic compound is placed under a reduced-pressure, the organic compound is heated by a heater at a temperature at which the organic compound is sublimated, and a high-purity region of the crucible is used as a vaporization source to evaporate the organic compound directly.

In this case, the purifying chamber is connected to the lower portion of the film forming chamber via a gate. When purification of an organic compound under an atmospheric pressure is completed in the purifying chamber, the purifying chamber is put in a reduced-pressure state, and an organic compound is evaporated onto a substrate in a film forming chamber by opening the gate.

As another method, the following structure may also be possible: an organic compound is separated on the region basis (i.e., an organic compound is formed in a plurality of crucibles). In this structure, only a crucible in a high-purity region including a finally highly purified organic compound as a result of purification is taken out, and provided in a vaporization source in a film forming chamber by a carrier mechanism. In this case, it is desirable to use crucibles each having an opening at a bottom stacked on one crucible. This is because the opening at a bottom allows an impurity to move together with a melted zone.

These and other advantages of the present invention will become apparent to those skilled in the art upon reading and understanding the following detailed description with reference to the accompanying figures.

DESCRIPTION OF THE PREFERRED EMBODIMENTS

Figure 1:
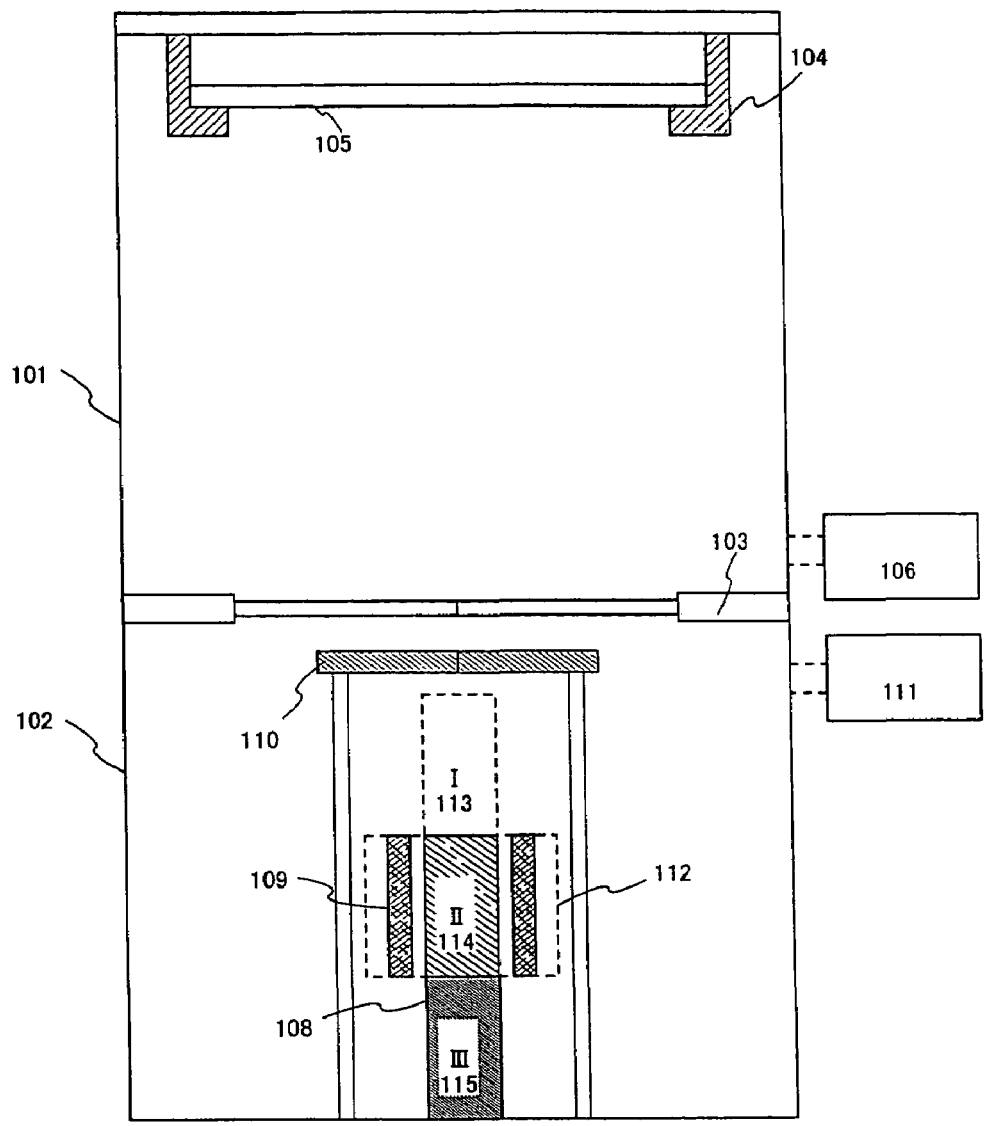
FIG. 1 is a drawing illustrating a film forming chamber and a purifying chamber.

Hereinafter, the present invention will be described by way of illustrative embodiments with reference to the drawings.

Embodiment Mode 1

In Embodiment Mode 1 of the present invention, the structures of a film forming chamber and a purifying chamber of a film forming apparatus will be described with reference to FIG. 1.

A film forming chamber 101 and a purifying chamber 102 are connected to each other via a gate 103. The purifying chamber 102 is disposed under the film forming chamber 101. The film forming chamber 101 is kept in a reduced-pressure state or a vacuum state by an exhaust system 106. In contrast, the purifying chamber 102 is generally kept in an atmospheric state during purification. Furthermore, a substrate 105 is disposed in the film forming chamber 101 by a substrate holder 104. The substrate 105 includes the state where a thin film is formed on the surface thereof.

A crucible 108 and a heater 109 are provided in the purifying chamber 102. The crucible 108 is provided with a solid organic compound serving as a material for forming an organic compound layer. Although not shown here, it may be possible that a cover is provided in an upper portion of the crucible 108 including an organic compound, and purification is conducted under the condition that the cover is closed. The purpose of providing the cover is to prevent a part of the organic compound from being vaporized during purification to scatter to the inside of the purifying chamber 102. Furthermore, the inside of the purifying chamber 102 is set in an atmosphere of an inert gas such as nitrogen and argon, and the pressure thereof is regulated to an atmospheric pressure.

Figure 2:
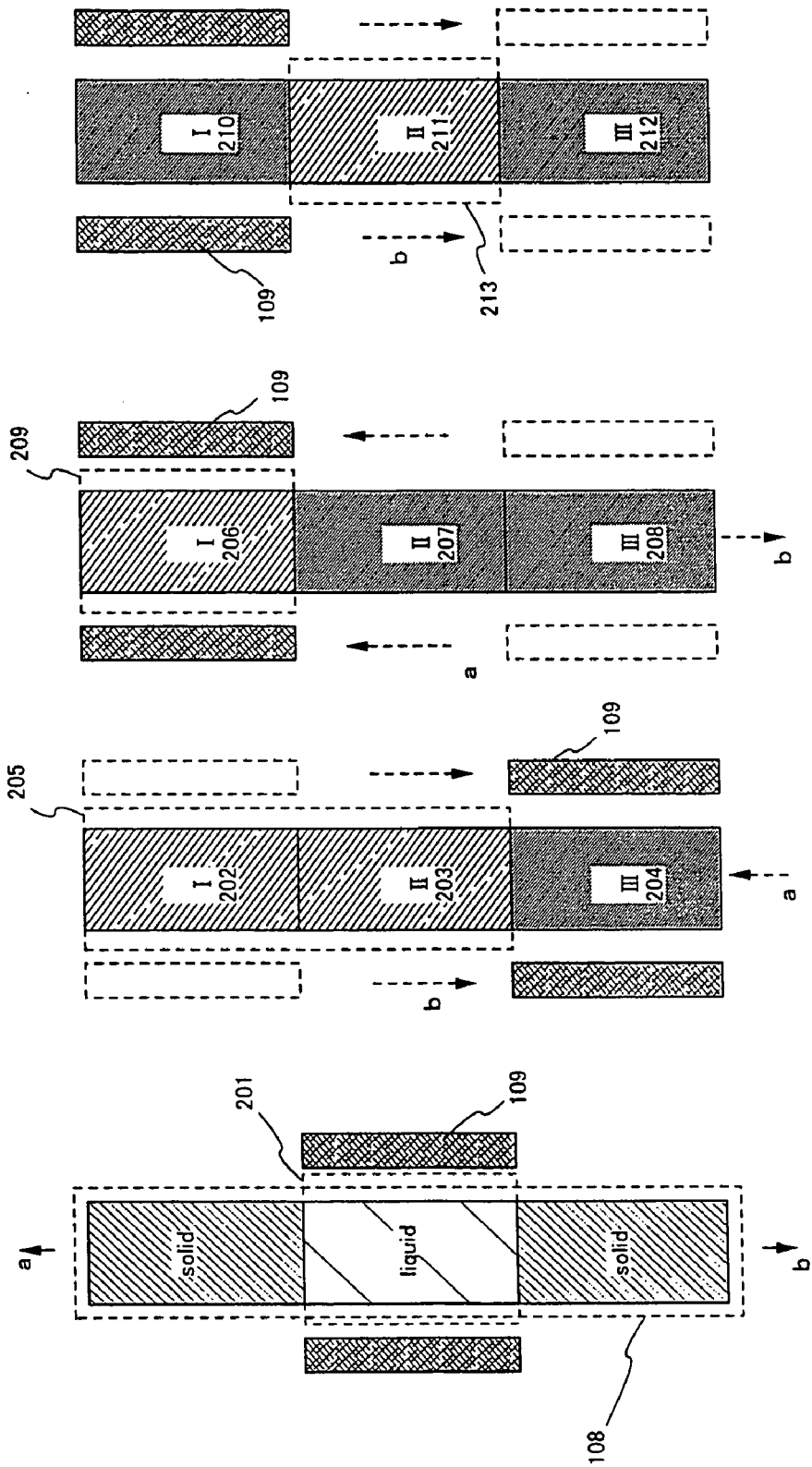
FIGS. 2A to 2D are drawings illustrating a purifying method.

The organic compound provided in the crucible 108 is heated by the heater 109. Therefore, as shown in FIG. 2A, an organic compound in a region heated by the heater 109 in the crucible 108 including the organic compound is changed from a solid to a liquid. In the region heated by the heater 109, a melted zone 201 is formed.

The melted zone 201 moves together with the movement of the heater 109. Therefore, a region that is not heated any more by the heater 109 is changed from a liquid to a solid.

In the case of Embodiment Mode 1, the heater 109 may be moved in a longitudinal direction of the crucible 108 or the crucible 108 may be moved. However, it is desirable to collect an organic compound with a high purity on the side of the film forming chamber of the crucible 108.

As shown in FIG. 2B, in the case where an impurity is brought in a liquid (K<1), the heater 109 is moved in a direction represented by an arrow "b" or the crucible 108 is moved in a direction represented by an arrow "a", whereby a high-purity region 205 can be formed in which an organic compound with a high purity is collected in a region I (202) and a region II (203).

Furthermore, as shown in FIG. 2C, in the case where an impurity is brought in a solid (K>1), the heater 109 is moved in a direction represented by the arrow "a" or the crucible 108 is moved in a direction represented by the arrow "b", whereby a high-purity region 209 can be formed in which an organic compound with a high purity is collected in a region I (206).

In the case of purifying an organic compound having an impurity (K<1) and an impurity (K>1), heating of the crucible 108 by the heater 109 is repeated, whereby an impurity region can be formed on both ends of the crucible 108, and a high-purity region can be formed in the vicinity of the center of the crucible 108.

FIG. 2D shows the case where heating by the heater 109 is repeated from the upper portion to the lower portion of the crucible 108 (in the direction represented by the arrow "b") with respect to the plane of the drawing.

In this case, an impurity (K>1) is collected in the upper portion (region I (210)) of the crucible 108, and an impurity (K<1) is collected in the lower portion (region II (212)) of the crucible 108. In the case where heating by the heater 109 is repeated from the lower portion of the crucible 108, the positions where the respective impurities are collected are reversed. In any case, a high-purity region 213 is positioned in the vicinity (region II (211)) of the center of the crucible 108.

As described above, when purification of the organic compound is completed, the pressure inside the purifying chamber 102 shown in FIG. 1 is reduced by an exhaust system 111. Herein, the case where the high-purity region shown in FIG. 2D is formed in the vicinity of the center of the crucible will be described. When the pressure in the purifying chamber 102 becomes the same as that in the film forming chamber 101, only a region I (113) is heated by the heater 109, and an impurity present in the region I (113) is removed by vaporization.

Then, when the impurity is removed, the purifying chamber 102 is connected to the film forming chamber 101 by opening the gate 103. In order to use a region II (114) that is a high-purity region as a vaporization source 112, the organic compound is heated by the heater 109 at a sublimation temperature of the organic compound, whereby the organic compound is vaporized.

A shutter 110 is provided for the purpose of preventing the organic compound from scattering from the vaporization source 112 to the film forming chamber 101. The vaporized organic compound is controlled by the shutter 110, and the organic compound can be evaporated onto the substrate 105 provided in the film forming chamber 101 by opening the shutter 110.

Therefore, the region II (114) that is a high-purity region can be positioned in an uppermost portion of the crucible 108, so that Embodiment Mode 1 can be achieved.

As a method for removing an impurity, in addition to exhaust of a vaporized impurity by an exhaust system as described above, an adhesion plate for intentionally allowing an impurity to adhere thereto is provided, and the adhesion plate is disposed in an upper portion of the crucible 108 only during removal of an impurity, whereby the impurity is allowed to adhere to the adhesion plate, and the impurity is removed together with the adhesion plate.

As described above, by using structure of FIG. 1, the purifying and the film forming are conducted continuously without exposing to air outside the purifying chamber and the film forming chamber. Therefore, film formation is conducted without decreasing the purity of the purified organic compound.

Embodiment Mode 2

Figure 3:
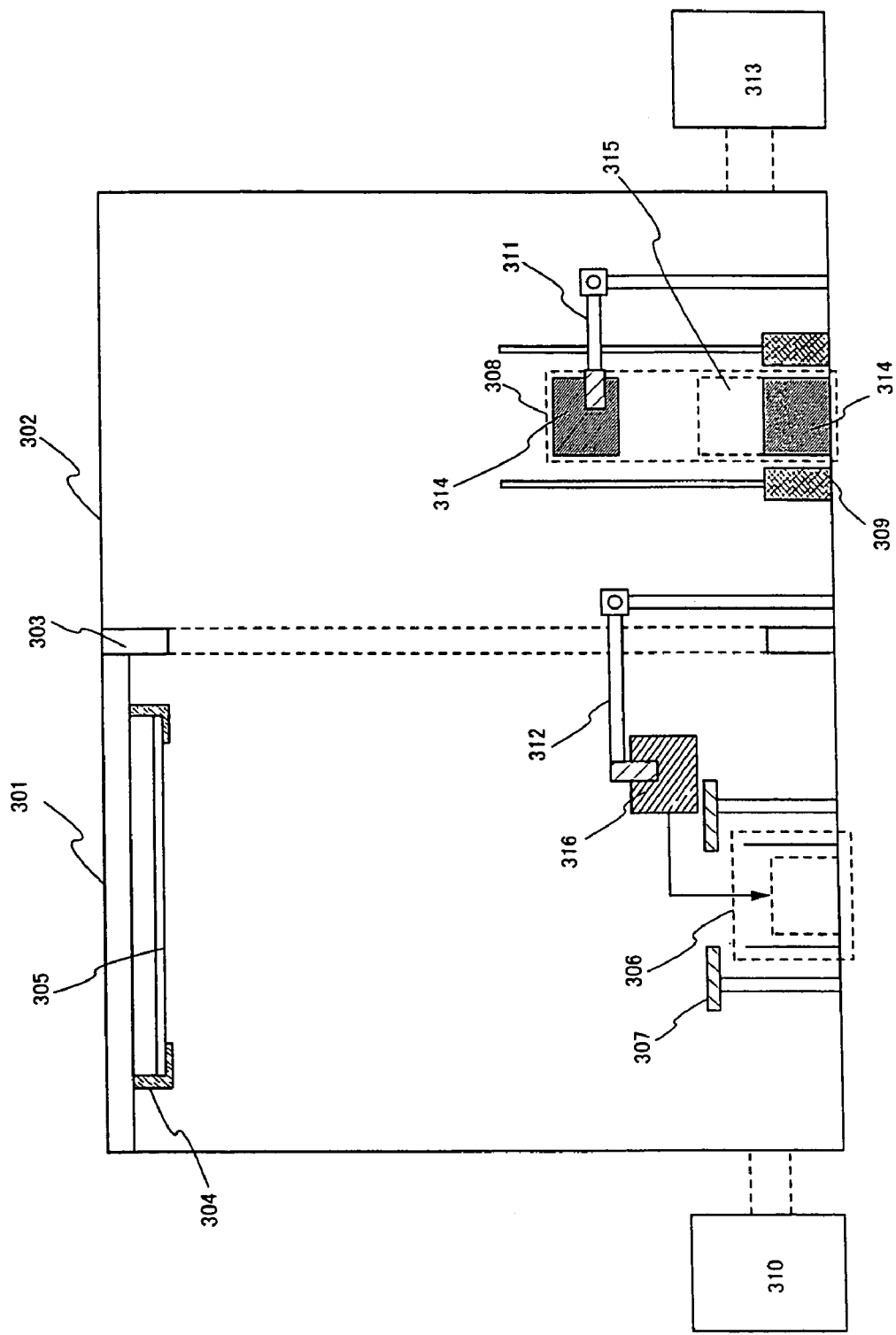
FIG. 3 is a drawing illustrating a film forming chamber and a purifying chamber.

FIG. 3 shows structures of a film forming chamber and a purifying chamber of a film forming apparatus in Embodiment Mode 2 of the present invention.

A film forming chamber 301 and a purifying chamber 302 are connected to each other via a gate 303. The film forming chamber 301 is kept in a reduced-pressure state or a vacuum state by an exhaust system 310. In contrast, the purifying chamber 302 is generally kept in an atmospheric state during purification. Furthermore, a substrate 305 is disposed in the film forming chamber 301 by a substrate holder 304. The substrate 305 includes the state where a thin film is formed on the surface thereof.

In the film forming chamber 301, a vaporization source 306 including an organic compound is disposed, and the organic compound vaporized by heating in a vaporization source 306 is evaporated onto the substrate 305 by opening a shutter 307. For heating of the organic compound in the vaporization source 306, resistance heating is used.

The purifying chamber 302 is provided with a crucible 308 and a heater 309. The crucible 308 is made of quartz, and provided with a solid organic compound serving as a material for forming an organic compound layer. In Embodiment Mode 2, the crucible 308 has a structure in which a plurality of crucibles each having an opening at a bottom portion are stacked on one crucible, and an organic compound is placed in the crucible 308, and heated by the heater 309. Furthermore, although not shown herein, the following may also be possible: a cover is placed in an upper portion of the uppermost crucible, an organic compound is provided in the crucible, and purification is conducted under the condition that the cover is closed. The purpose of providing the cover is to prevent a part of an organic compound from being vaporized to scatter in the purifying chamber 302 during purification.

The purpose of using the above-mentioned structure in which a plurality of crucibles each having an opening at a bottom portion are stacked on one crucible is to allow a melted zone and an impurity to move in the crucible by heating with the heater, and to allow only an organic compound in a high-purity region obtained by purification to be carried to the vaporization source.

The inside of the purifying chamber 302 is set in an atmosphere of an inert gas such as nitrogen and argon. The pressure thereof is regulated to an atmospheric pressure.

The organic compound provided in the crucible 308 is heated by the heater 309. Therefore, the organic compound in the heated region is changed from a solid to a liquid. In the region heated by the heater 309, a melted zone is formed.

The melted zone moves together with the movement of the heater 309. Therefore, a region that is not heated any more by the heater 309 is changed from a liquid to a solid.

Figures 4A, 4B, 4C, 4D:
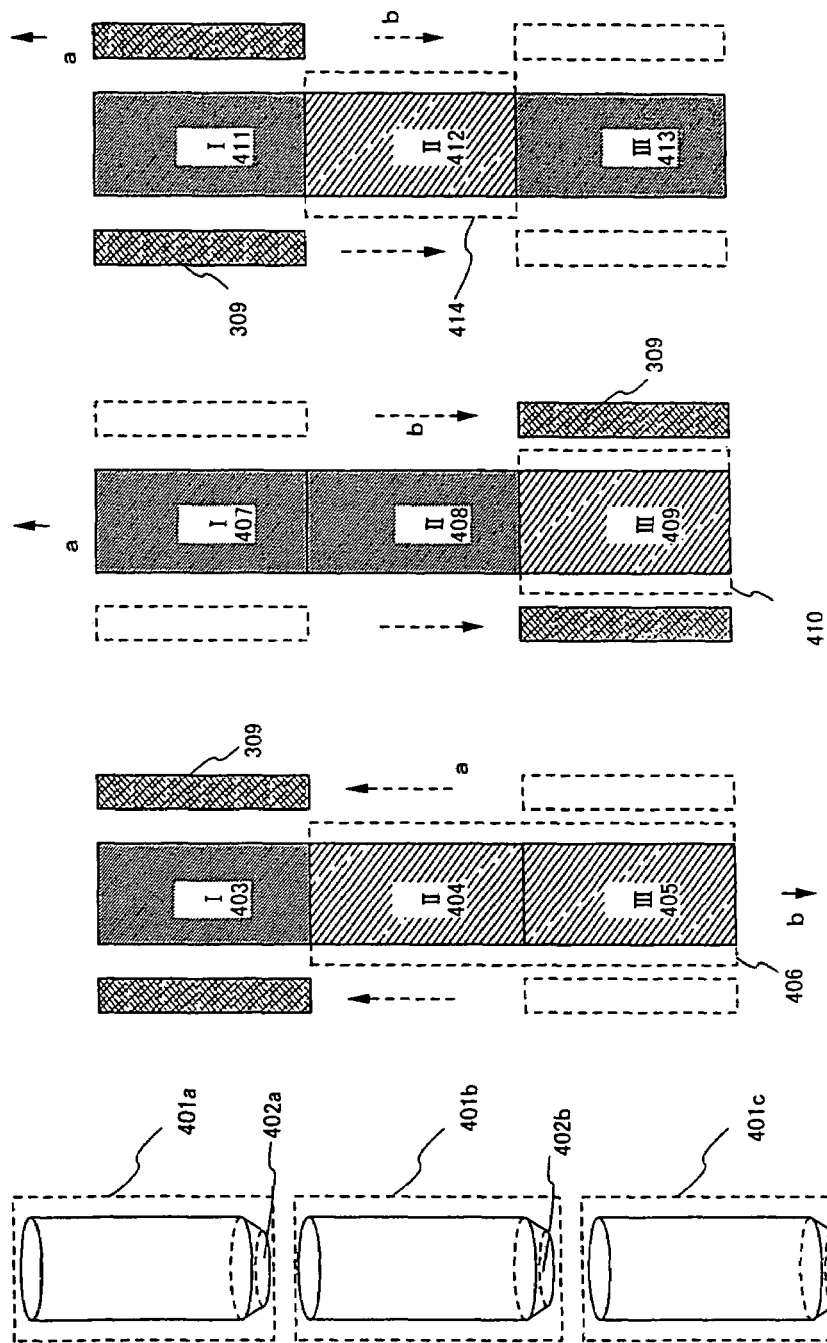
FIGS. 4A to 4D are drawings illustrating a purifying method.

In the case of Embodiment Mode 2, the heater 309 may be moved or the crucible 308 may be moved. In Embodiment Mode 2, as shown in FIG. 4A, the crucible made of quartz has a structure, for example, in which a crucible "a" (401a), a crucible "b" (401b), and a crucible "c" (401c) are stacked on each other, and they can be separated from each other. The undermost crucible (i.e., the crucible "c" (401c)) does not have an opened bottom, whereas the crucible "a" (401a) and the crucible "b" (401b) have openings 402a and 402b, respectively, and are stacked on the crucible "c" (401c). Herein, the case has been described in which three crucibles are stacked on each other; however, in the present embodiment mode, two crucibles or four or more crucibles may be used.

There are provided carrier mechanisms "a" and "b" (311 and 312) for carrying the crucible to the film forming chamber 301. Therefore, the position where a highly purified organic compound is formed (i.e., the position where a high-purity region is formed) may be placed at the center of the crucible or on either side thereof. More specifically, such a position may be placed in the crucible "b" (401b), the crucible "a" (401a), or the crucible "c" (401c).

In the case where a high-purity region is formed in the crucible "a" (401a), the heater or the crucible may be moved in the same way as in Embodiment Mode 1.

On the other hand, in the case where a high-purity region is formed in the crucible "b" (401b) or the crucible "c" (401c), the high-purity region is formed in accordance with an effective distribution coefficient (K), as shown in FIG. 4B or 4C.

First, in the case where an impurity is brought in a liquid (K<1) as shown in FIG. 4B, the heater 309 is moved in a direction represented by an arrow "a", or the crucible 308 is moved in a direction represented by an arrow "b", whereby a high-purity region 406 can be formed in which a highly purified organic compound is collected in a region II (404) and a region III (405).

Then, as shown in FIG. 4C, in the case where an impurity is brought in a solid (K>1) the heater 309 is moved in the direction represented by the arrow "a", or the crucible 308 is moved in the direction represented by the arrow "b", whereby a high-purity region 410 can be formed in which a highly purified organic compound is collected in a region III (409).

Furthermore, in the case of purifying an organic compound containing both an impurity (K<1) and an impurity (K>1), heating of the crucible by the heater is repeated as described in Embodiment Mode 1, whereby an impurity region is formed at both ends of the crucible, and a high-purity region can be formed in the vicinity of the center of the crucible.

FIG. 4D shows the case where heating by the heater 309 is repeated from the upper portion to the lower portion of the crucible 308 (in the direction represented by the arrow "b") with respect to the plane of the drawing. In this case, an impurity (K>1) is collected in the upper portion (region I (411)) of the crucible 308, and an impurity (K<1) is collected in the lower portion (region III (413)) of the crucible 308. In the case where heating by the heater 309 is repeated from the lower portion of the crucible 308, the positions where the respective impurities are collected are reversed. In any case, a high-purity region is positioned in the vicinity of the center of the crucible 308, and the region II (412) in FIG. 4D becomes a high-purity region 414.

When the high-purity region (406, 410, 414) is formed, and purification of the organic compound is completed, heating of the crucible 308 by the heater 309 is terminated, and the pressure inside the purifying chamber 302 shown in FIG. 3 is reduced by an exhaust system 313. When the pressure in the purifying chamber 302 becomes the same as that in the film forming chamber 301, the purifying chamber 302 is connected to the film forming chamber 301 by opening the gate 303.

In Embodiment Mode 2, the case where an impurity (K<1) and an impurity (K>1) are contained in an organic compound will be described.

The crucible positioned in the impurity region 314 containing an impurity is moved by the carrier mechanism "a" (311), and the crucible "a" (316) positioned in the high-purity region 315 is carried by the carrier mechanism "b" (312) from the purifying chamber 302 to the vaporization source 306 in the film forming chamber 301.

The purified organic compound is carried to the vaporization source 306 together with the crucible. When the organic compound is carried, the gate 303 is closed, whereby the film forming chamber 301 and the purifying chamber 302 are separated from each other. The organic compound purified by resistance heating in the vaporization source 306 is vaporized.

As described above, by using structure of FIG. 3, the purifying and the film forming are conducted continuously without exposing to air outside the purifying chamber and the film forming chamber. Therefore, film formation is conducted without decreasing the purity of the purified organic compound.

In addition, the shutter 307 is provided for the purpose of preventing the organic compound from scattering from the vaporization source 306 to the film forming chamber 301. The vaporized organic compound is controlled by the shutter 307, and can be evaporated onto the substrate 305 placed in the film forming chamber 301 by opening the shutter 307.

In Embodiment Mode 2, the case has been described in which the organic compound is purified under an atmospheric pressure. In some cases, purification may be conducted at 5 or lower atmospheric pressure.

In the present embodiment mode, a method for heating by the heater includes not only heating with radiant heat using a heating element (metal wire with a high electric resistance), but also heating with infrared light or UV-light (halogen lamp). The heater in the present invention is capable of heating up to 600° C. Furthermore, the heater can be moved at a speed of $10^{-2}$ to 10 cm/h. The crucible may be designed to be rotated at 1 to 50 rpm so that heating by the heater is conducted equally.

EMBODIMENTS

Embodiment 1

In the present embodiment, a method will be described in which vapor deposition is conducted onto a substrate provided in a film forming chamber, using a vaporization source obtained by heating an organic compound for forming a high-purity region by a heater among an organic compound provided in a crucible in a purifying chamber, as described in Embodiment Mode 1.

Figure 5:
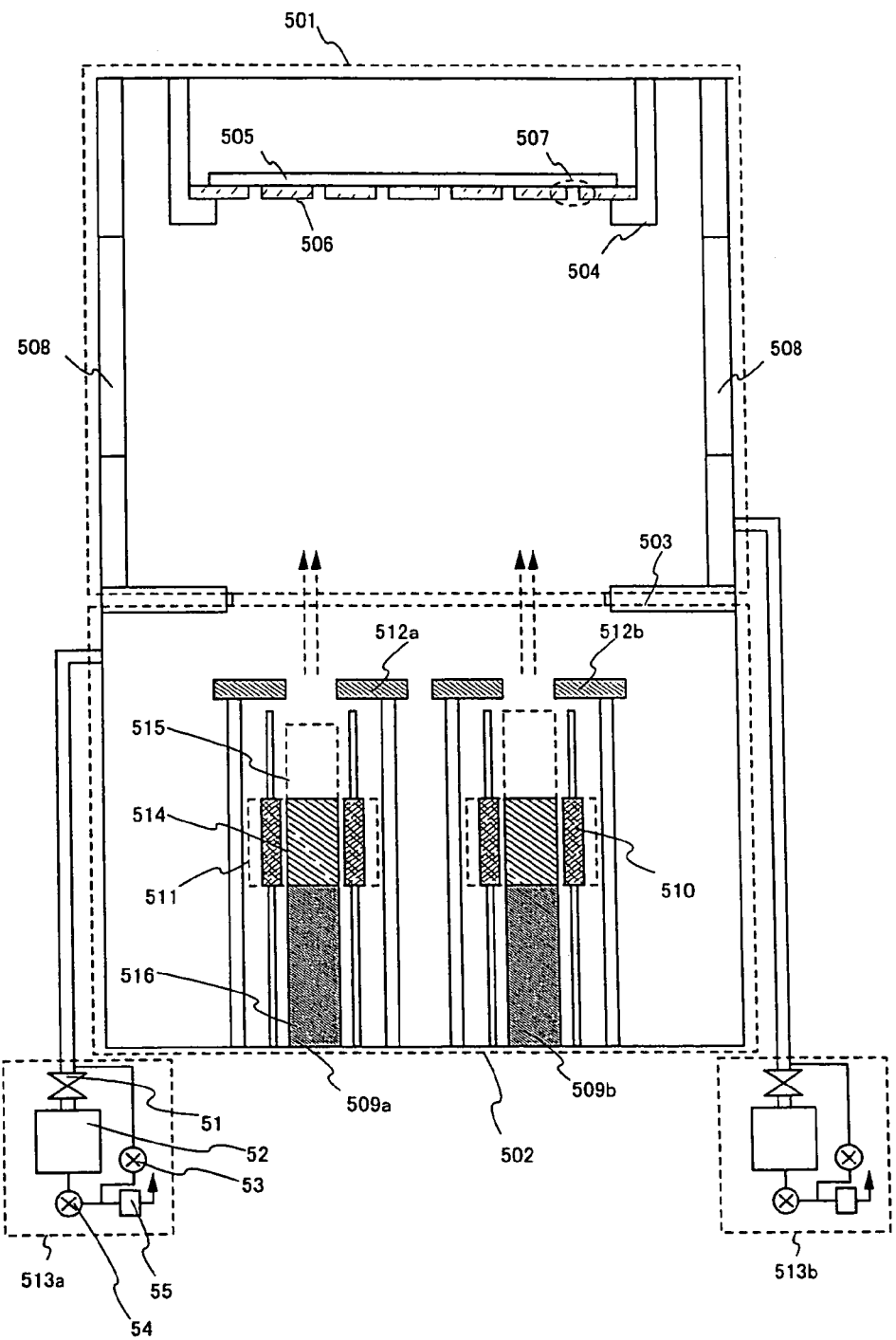
FIG. 5 is a drawing illustrating a film forming chamber and a purifying chamber.

FIG. 5 shows cross-sectional structures of a film forming chamber and a purifying chamber in a film forming apparatus of the present embodiment. In FIG. 5, a film forming chamber 501 and a purifying chamber 502 are connected to each other via a gate 503. The purifying chamber 502 is disposed under the film forming chamber 501. In the film forming chamber 501, a substrate 505 is disposed by a substrate holder 504. The substrate 505 includes the state where a thin film is formed on the surface thereof.

A metal mask 506 is provided in the vicinity of the substrate 505, and the metal mask 506 is supported by the substrate holder 504. An organic compound passing through an opening 507 of the metal mask 506 is evaporated onto the substrate 505 during film formation.

Furthermore, the film forming chamber 501 is connected to a treatment chamber such as another film forming chamber and an alignment chamber via a gate 508. The substrate 505 is carried through the gate 508.

In the purifying chamber 502, a crucible 509 and a heater 510 are provided. The crucible 509 is provided with a solid organic compound serving as a material for forming an organic compound layer. Furthermore, the inside of the purifying chamber 502 is placed in an atmosphere of an inert gas such as nitrogen and argon, and the pressure thereof is regulated to an atmospheric pressure.

In the present embodiment, there are two crucibles 509a and 509b as shown in FIG. 5. The first crucible 509a purifies a first organic compound for forming a first functional region, and the second crucible 509b purifies a second organic compound for forming a second functional region. Furthermore, the functional region in the present embodiment refers to a region made of an organic compound having properties of hole injection, hole transport, light emission, electron injection, electron transport, and blocking.

That is, herein, organic compound layers having different functional regions can be formed by using two kinds of organic compounds. Two kinds of organic compounds may be formed by evaporation separately at an interval or continuously. Two kinds of organic compounds may also be formed by evaporation simultaneously.

The film forming speed at which these organic compounds are evaporated may be controlled automatically by a microcomputer.

In the present embodiment, the case has been described in which two kinds of organic compounds are purified in the purifying chamber. It may also be possible that one kind of organic compound is purified more than once in a plurality of crucibles. It may also be possible that a plurality of kinds of organic compounds are purified in a plurality of crucibles, and evaporated onto a substrate as described above.

In the present embodiment, the organic compound in the crucible 509 is repeatedly moved upward while being heated by the heater 510 at 200° C. to 500° C., and a highly purified organic compound is collected in the vicinity of the center of the crucible 509 to form a high-purity region 514. The moving speed of the heater in the present embodiment is desirably 1 to 5 cm/h.

The first organic compound and the second organic compound used in the present embodiment contain an impurity (K>1) and an impurity (K<1).

When the high-purity region 514 is formed, and purification of the organic compound is completed, the pressure in the purifying chamber 502 shown in FIG. 5 is reduced by an exhaust system 513a. The vacuum degree attained in the purifying chamber 502 at this time is $10^{-5}$ to $10^{-6}$ Pa.

In the present embodiment, the exhaust system 513a includes a first valve 51, a cryopump 52, a second valve 53, a third valve 54, and a dry pump 55.

Although the first valve 51 is a main valve having a gate valve, a butterfly valve also functioning as a conductance valve may be used. The second valve 53 and the third valve 54 are forevalves. First, the second valve 53 is opened, whereby the purifying chamber 502 is roughly decompressed by the dry pump 55. Then, the first valve 51 and the third valve 54 are opened, whereby the purifying chamber 502 is decompressed to a high vacuum by the cryopump 52. A turbo molecular pump or a mechanical booster pump may be used in place of a cryopump. Alternatively, a cryopump may be used after the vacuum degree is increased by a mechanical booster pump. The inside of the film forming chamber 501 may be decompressed through an exhaust system 513b having a similar structure to that of the exhaust system 513a.

When the pressure of the purifying chamber 502 becomes the same as that of the film forming chamber 501, the first impurity region 515 is vaporized by heating with the heater 510. Therefore, an impurity present in the purity region 515 can be removed through the exhaust system 513a.

When the first impurity region 515 is removed, the purifying chamber 502 is connected to the film forming chamber 501 by opening the gate 503. Then, in order to use the high-purity region 514 as a vaporization source 511, the high-purity region 514 is heated by the heater 510, whereby the organic compound is vaporized. The temperature at this time is desirably 250° C. or lower.

Shutters (512a, 512b) are provided for the purpose of preventing the organic compound from scattering from the vaporization source 511 to the film forming chamber 501. The vaporized organic compound is controlled by the shutters (512a, 512b), and can be evaporated onto the substrate 505 provided in the film forming chamber 501 by opening the shutters (512a, 512b).

In the present embodiment, first, the shutter 512a is opened, whereby the first organic compound is evaporated to form a first functional region. Thereafter, the shutter 512b is opened, whereby the first organic compound and the second organic compound are simultaneously evaporated to form a mixed region made of two kinds of organic compounds. Finally, only the shutter 512a is closed, whereby the second organic compound is evaporated to form a second functional region.

As described above, an organic compound layer in the present embodiment can be formed.

Embodiment 2

In the present embodiment, a method will be described in which a crucible having a high-purity region in an organic compound provided in a crucible in a purifying chamber is carried to a vaporization source in a film forming chamber by a carrier mechanism, and evaporation is conducted onto a substrate provided in the film forming chamber, as described in Embodiment Mode 2. The crucible in the present embodiment has a structure in which a plurality of crucibles are stacked on each other as shown in FIG. 4A. Therefore, even if a high-purity region is formed at any position of the crucible, only a highly purified organic compound can be easily taken out without removing an impurity by vaporization as in Embodiment 1.

Figure 6:
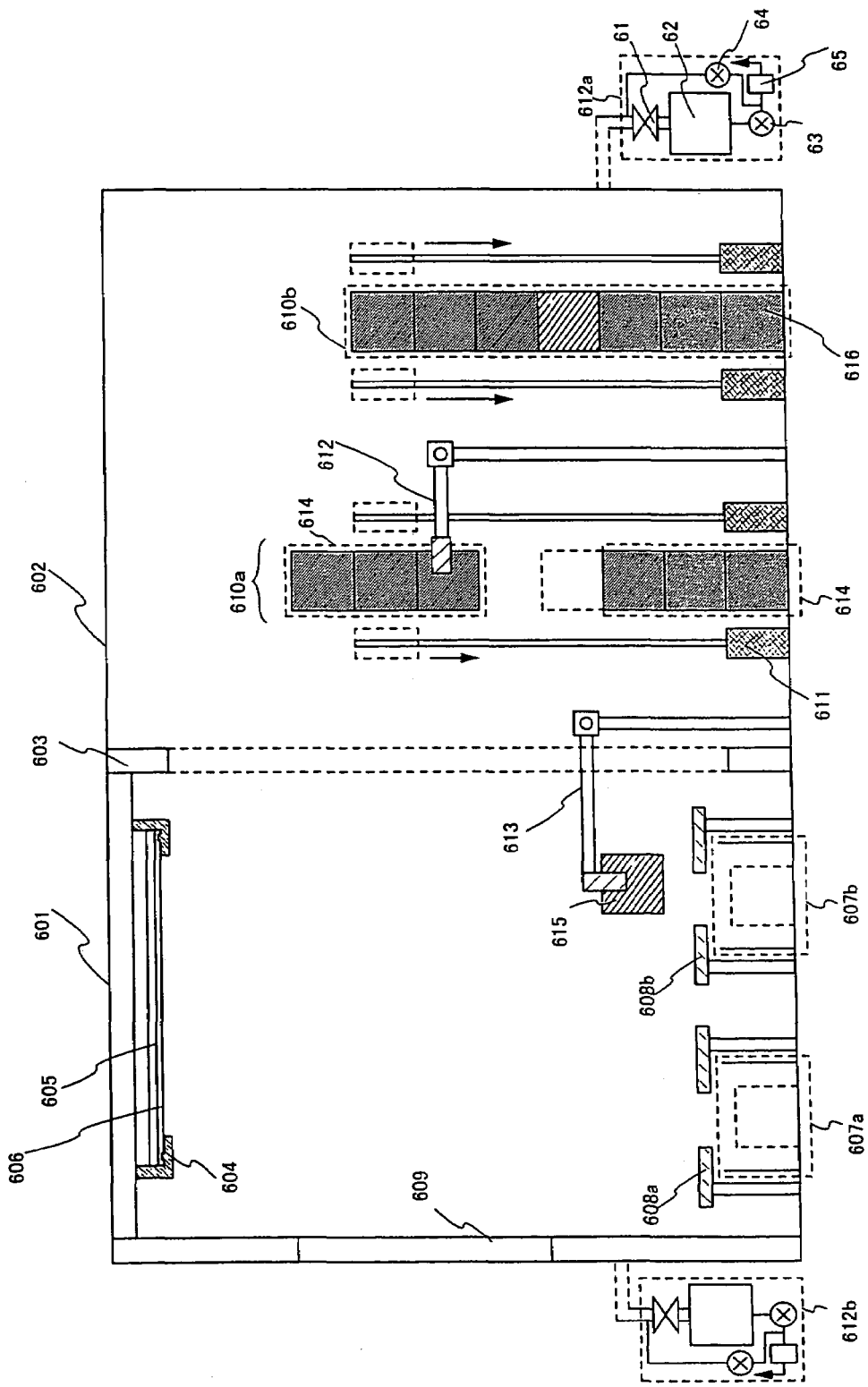
FIG. 6 is a drawing illustrating a film forming chamber and a purifying chamber.

FIG. 6 shows cross-sectional structures of a film forming chamber and a purifying chamber in a film forming apparatus of the present embodiment. In FIG. 6, a film forming chamber 601 and a purifying chamber 602 are connected to each other via a gate 603. In the film forming chamber 601, a substrate 605 is disposed by a substrate holder 604. The substrate 605 includes the state where a thin film is formed on the surface thereof.

A metal mask 606 is provided in the vicinity of the substrate 605, and the metal mask 606 is supported by the substrate holder 604. Furthermore, a vaporization source 607 provided with a vaporization material is disposed in the film forming chamber 601. In the vaporization source 607, an organic compound vaporized by resistance heating has its scattering controlled by a shutter 608 provided between the vaporization source 607 and the substrate 605. More specifically, when the shutter 608 is opened, a vaporization material (organic compound) scattering from the vaporization source 607 is evaporated onto the substrate 605, and when the shutter 608 is closed, the vaporization material is not evaporated onto the substrate 605.

During film formation, an organic compound passing through an opening (not shown) of the metal mask 606 is evaporated onto the substrate 605.

Furthermore, the film forming chamber 601 is connected to a treatment chamber such as another film forming chamber and an alignment chamber via a gate 609. The substrate 605 is carried through the gate 609.

In the purifying chamber 602, a crucible 610 and a heater 611 are provided. The crucible 610 is provided with a solid organic compound serving as a material for forming an organic compound layer. Furthermore, the inside of the purifying chamber 602 is placed in an atmosphere of an inert gas such as nitrogen and argon, and the pressure thereof is regulated to an atmospheric pressure. In the present embodiment, there are two crucibles 610a and 610b as shown in FIG. 6. The first crucible 610a purifies a first organic compound, and the second crucible 610b purifies a second organic compound.

In the present embodiment, the first crucible 610a purifies a first organic compound for forming a first functional region, and the second crucible 610b purifies a second organic compound for forming a second functional region. In the present embodiment, the functional region in the present embodiment refers to a region made of an organic compound having properties of hole injection, hole transport, light emission, electron injection, electron transport, and blocking.

That is, herein, organic compound layers having different functional regions can be formed by using two kinds of organic compounds. Two kinds of organic compounds may be formed by evaporation separately at an interval or continuously. Two kinds of organic compounds may also be formed by evaporation simultaneously.

The film forming speed at which these organic compounds are evaporated may be controlled automatically by a microcomputer.

In the present embodiment, the case has been described in which two kinds of organic compounds are purified in the purifying chamber. It may also be possible that one kind of organic compound is purified more than once in a plurality of crucibles. It may also be possible that a plurality of kinds of organic compounds are purified in a plurality of crucibles, and evaporated onto a substrate as described above.

In the present embodiment, the organic compound in the crucible 610 is moved upward while being heated by the heater 611 at 200° C. to 500° C. to collect a highly purified organic compound in a part of the crucible 610, whereby a high-purity region is formed. The moving speed of the heater 611 in the present embodiment is desirably 1 to 5 cm/h.

The first organic compound and the second organic compound used in the present embodiment contain an impurity (K>1) and an impurity (K<1). That is, a high-purity region is formed in the vicinity of the center of a plurality of stacked crucibles.

In the present embodiment, when the high-purity region 615 is formed, and purification of the organic compound is completed, the pressure in the purifying chamber 602 shown in FIG. 6 is reduced by an exhaust system 612a. The vacuum degree attained in the purifying chamber 602 in the present embodiment is $10^{-5}$ to $10^{-6}$ Pa.

In the present embodiment, the exhaust system 612a includes a first valve 61, a cryopump 62, a second valve 63, a third valve 64, and a dry pump 65. An exhaust system 612b having the similar structure to that of the exhaust system 612a is connected to the film forming chamber 601, whereby the inside of the film forming chamber 601 is decompressed.

Although the first valve 61 is a main valve having a gate valve, a butterfly valve also functioning as a conductance valve may be used. The second valve 63 and the third valve 64 are forevalves. First, the second valve 63 is opened, whereby the purifying chamber 602 is roughly decompressed by the dry pump 65. Then, the first valve 61 and the third valve 64 are opened, whereby the purifying chamber 602 is decompressed to a high vacuum by the cryopump 62. A turbo molecular pump or a mechanical booster pump may be used in place of a cryopump. Alternatively, a cryopump may be used after the vacuum degree is increased by a mechanical booster pump.

When the pressure of the purifying chamber 602 becomes the same as that of the film forming chamber 601, the purifying chamber 602 is connected to the film forming chamber 601 by opening the gate 603. Then, a plurality of crucibles 614 containing an impurity are moved by a carrier mechanism "a" (612), and a crucible "b" (615) containing a highly purified organic compound is taken out by a carrier mechanism "b" (613) and carried from the purifying chamber 602 to the inside of the vaporization source 607a in the film forming chamber 601. Furthermore, a crucible "c" (616) that is made highly purified in the second crucible 610b is also carried to the inside of the vaporization source 607b.

In the present embodiment, the crucibles (610a, 610b) are composed of a plurality of crucibles as shown in FIG. 4A. Therefore, it is easy to take out only a highly purified organic compound in a high-purity region formed in the vicinity of the center with respect to the longitudinal direction of a plurality of stacked crucibles.

When the highly purified organic compound is provided in the vaporization source 607, the first and second organic compounds are vaporized by the vaporization sources 607a and 607b, respectively, and evaporated onto the substrate 605 when the shutters (608a, 608b) are opened. In the present embodiment, the shutters (608a, 608b) are simultaneously opened. Therefore, an organic compound layer made of a first organic compound and a second organic compound is formed on the substrate 605.

Herein, although not shown, in order to prevent a vaporization material from scattering to adhere to the inside of the film forming chamber 601, an adhesion-preventing shield can be provided. If a heater or the like for heating the adhesion-preventing shield is provided, an adhering vaporization material can be sublimated again to be removed or collected.

Embodiment 3

In the present embodiment, the case will be described in which a plurality of heaters are provided with respect to one crucible.

Figures 7A, 7B:
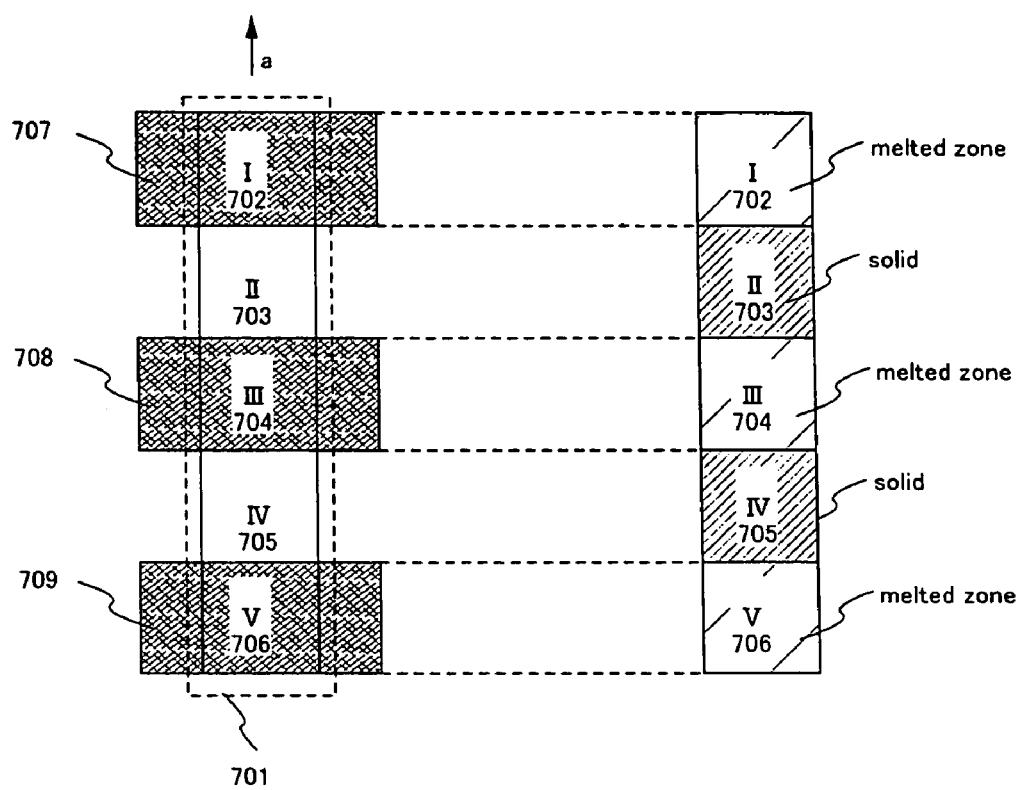
FIGS. 7A and 7B are drawings illustrating a film forming apparatus.

FIG. 7A shows a crucible and heaters provided in a film forming chamber. A crucible 701 is provided with a solid organic compound.

A heater I (707), a heater II (708), and a heater III (709) are provided so as to heat a region I (702), a region III (704), and a region V (706) of the crucible 701.

The crucible 701 is moved at a speed of 1 to 5 cm/h in a direction represented by an arrow "a" while being heated with the heaters. Therefore, a melted zone in a liquid state is formed in the regions heated by the heaters, and a solid state is formed in the regions not heated by the heaters, as shown in FIG. 7B.

By repeatedly forming a solid state and a liquid state by a plurality of heaters, the purity of an organic compound can be enhanced.

In the present embodiment, the case has been described in which three heaters are provided, and five regions are formed. In this case, a melted zone is formed three times in a region V (706). That is, by providing a plurality of heaters as described in the present embodiment, the same effects as those obtained when purification is conducted a plurality of times can be obtained.

In the present embodiment, in the case where either an impurity (K>1) or an impurity (K<1) is contained in an organic compound, a high-purity region can be formed on one end of the crucible. However, in the case where both the impurity (K>1) and the impurity (K<1) are contained in the organic compound, a high-purity region can be formed in the vicinity of the center of the crucible.

In the present embodiment, the case has been described in which three heaters are provided, and a region where a melted zone is formed three times is present. However, the present embodiment is not limited thereto. Two heaters or four or more heaters may be used. Furthermore, the structure of the present embodiment can be freely combined with the structure of Embodiment 1 or 2.

Embodiment 4

Figure 8:
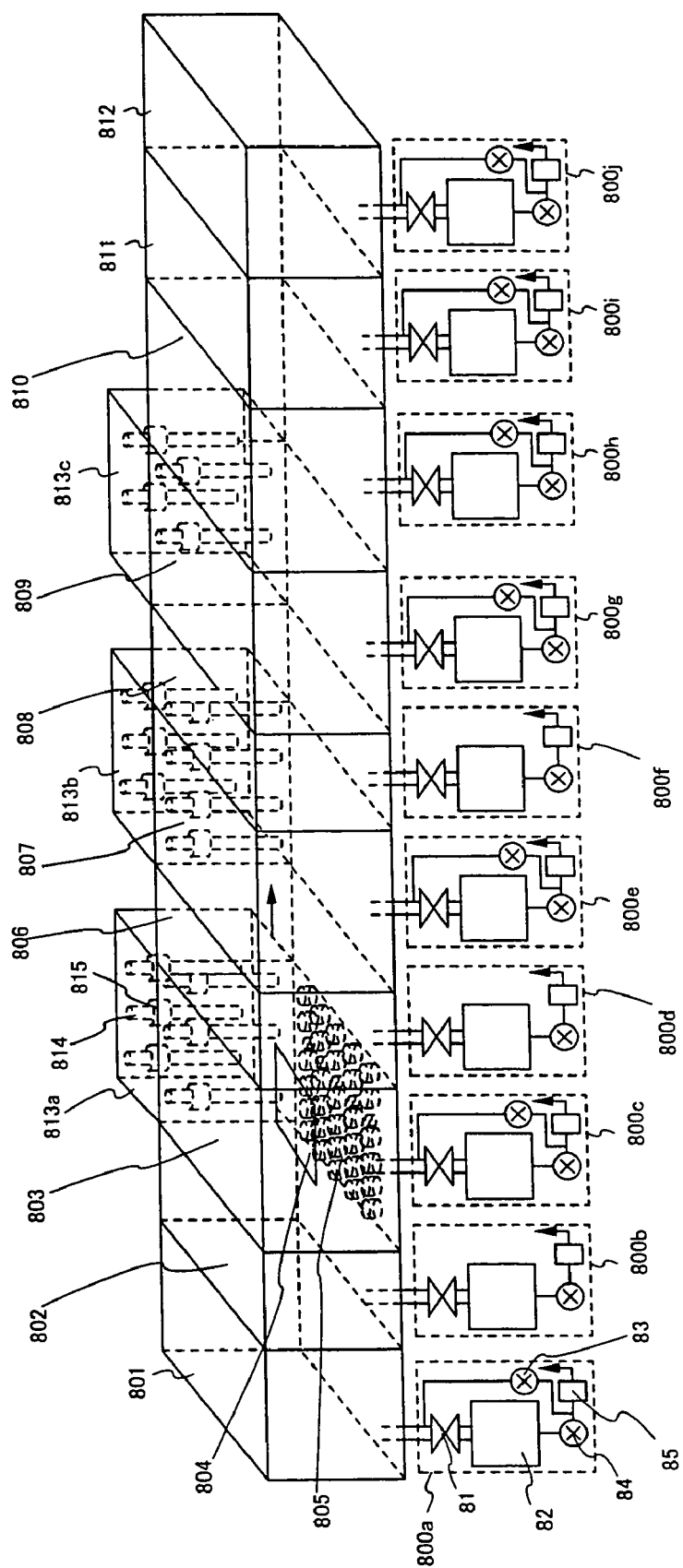
FIG. 8 is a drawing illustrating a film forming apparatus.

The case will be described with reference to FIG. 8 in which a film forming apparatus of the present invention is of an in-line system. In the present embodiment, the structures of the film forming chamber and the purifying chamber described in Embodiment 1 or 2 can be combined. In FIG. 8, reference numeral 801 denotes a load chamber, and a substrate starts being carried therefrom. The substrate in the present embodiment refers to a substrate on which an anode or a cathode (anode in the present embodiment) of a light-emitting element has been formed so far. Furthermore, the load chamber 801 is provided with an exhaust system 800a, and the exhaust system 800a includes a first valve 81, a cryopump 82, a second valve 83, a third valve 84, and a dry pump 85.

Since the vacuum degree attained in the film forming chamber is desirably $10^{-6}$ Pa or less, it is desirable to use an exhaust pump with an exhaust speed of 10000 l/s or more.

Furthermore, in the present embodiment, as materials used for the inside of each treatment chamber such as a load chamber, an alignment chamber, a film forming chamber, a sealing chamber, and an unload chamber, which are shut off by a gate; aluminum, stainless steel (SUS), or the like subjected to mirror-finish by electropolishing is used for an inner wall surface, and an inner member is used which is made of a material such as ceramics treated so as to have a remarkably decreased number of pores. This is because the adsorptivity of an impurity such as oxygen and water can be decreased in these materials by reducing a surface area thereof. These materials have such a surface smoothness as to obtain an average surface roughness of 5 nm or less (preferably, 3 nm or less). The average surface roughness herein refers to a center line average roughness defined by JIS B0601 expanded three-dimensionally so as to be applied to a surface.

In addition, there is also a method for forming an active surface on an inner wall of the film forming chamber by using a material that is likely to react with a gas. As materials in this case, Ti, Zr, Nb, Ta, Cr, Mo, W, La, Ba, and the like may be used.

Although the first valve 81 is a main valve having a gate valve, a butterfly valve also functioning as a conductance valve may be used. The second valve 83 and the third valve 84 are forevalves. First, the second valve 83 is opened, whereby the load chamber 801 is roughly decompressed by the dry pump 85. Then, the first valve 81 and the third valve 84 are opened, whereby the load chamber 801 is decompressed to a high vacuum by the cryopump 82. A turbo molecular pump or a mechanical booster pump may be used in place of a cryopump. Alternatively, a cryopump may be used after the vacuum degree is increased by a mechanical booster pump.

Reference numeral 802 denotes an alignment chamber. In this alignment chamber, alignment of a metal mask and placement of a substrate onto the metal mask are conducted for film formation in the subsequent film forming chamber. This alignment chamber is referred to as an alignment chamber (A) 802. The alignment chamber (A) 802 is provided with an exhaust system 800b. The alignment chamber (A) 802 is shut off by a gate (not shown) from the load chamber 801.

Next, reference numeral 803 denotes a film forming chamber for forming a first organic compound layer by vapor deposition. This film forming chamber is referred to as a film forming chamber (A) 803. The film forming chamber (A) 803 is provided with an exhaust system 800c. The film forming chamber (A) 803 is shut off by a gate (not shown) from the alignment chamber (A) 802.

In the present embodiment, the film forming chamber with the structure shown in FIG. 6 is provided as the film forming chamber (A) 803, in which a first organic compound layer emitting red light is formed into a film. In the same way as in FIG. 6, the film forming chamber (A) 803 is connected to a purifying chamber 813a via a gate.

As vaporization sources, there are provided a first vaporization source including an organic compound with a hole injection property, a second vaporization source including an organic compound with a hole transport property, a third vaporization source including an organic compound with a hole transport property serving as a host of an organic compound with a light emission property, a fourth vaporization source including an organic compound with a light emission property, a fifth vaporization source including an organic compound with a blocking property, and a sixth vaporization source including an organic compound with an electron transport property.

By evaporating these organic compounds successively, an organic compound layer can be formed on an anode, which is composed of functional regions having properties of hole injection, hole transport, light emission, blocking, and electron transport.

In the present embodiment, at an interface between different functional regions, a mixed region is formed by simultaneously evaporating organic compounds for forming the functional regions. More specifically, a mixed region is formed at an interface between the hole injection region and the hole transport region, an interface between the hole transport region and the hole transport region including a light emission region, an interface between the hole transport region including a light emission region and the blocking region, and an interface between he blocking region and the electron transport region.

A purifying chamber 813a is provided with crucibles 814. The purifying chamber 813a is also provided with heaters 815 for heating crucibles 814. Furthermore, in the present embodiment, crucibles for purifying six organic compounds to be provided in vaporization sources are provided. Furthermore, as the purifying chamber 813a, the purifying chambers with the structures described in Embodiments 1 to 3 can be combined. Therefore, the detailed description thereof should be referred to Embodiments 1 to 3.

Herein, the case has been described in which, as a first organic compound layer, six kinds of organic compounds with different functions are provided in six vaporization sources, respectively, and these organic compounds are evaporated successively to form an organic compound layer. However, the present invention is not limited thereto. Any plural number of organic compounds may be used. Furthermore, the number of an organic compound to be provided in one vaporization source is not necessarily one, and a plurality of organic compounds may be provided in one vaporization source. For example, in addition to one kind of material provided as an organic compound with a light emission property in a vaporization source, another organic compound serving as a dopant may be provided. As an organic compound for forming an organic compound layer emitting red light having the above-mentioned plurality of functions, known materials may be used.

The vaporization sources may be designed so as to control the film forming speed by a microcomputer. Furthermore, the vaporization sources may be designed so that a plurality of organic compounds are formed into a film simultaneously, and a mixture ratio thereof is controlled.

Reference numeral 806 denotes an alignment chamber. In this alignment chamber, alignment of a metal mask and placement of a substrate onto the metal mask are conducted for film formation in the subsequent film forming chamber. This alignment chamber is referred to as an alignment chamber (B) 806. The alignment chamber (B) 806 is provided with an exhaust system 800d. The alignment chamber (B) 806 is shut off by a gate (not shown) from the film forming chamber (A) 803.

Next, reference numeral 807 denotes a film forming chamber for forming a second organic compound layer by vapor deposition. This film forming chamber is referred to as a film forming chamber (B) 807. The film forming chamber (B) 807 is provided with an exhaust system 800e. The film forming chamber (B) 807 is shut off by a gate (not shown) from the alignment chamber (B) 806.

In the present embodiment, the film forming chamber with the structure shown in FIG. 6 is provided as the film forming chamber (B) 807, in which a second organic compound layer emitting green light is formed into a film. In the same way as in FIG. 6, the film forming chamber (B) 807 is connected to a purifying chamber 813b via a gate.

As vaporization sources, there are provided a first vaporization source including an organic compound with a hole injection property, a second vaporization source and a third vaporization source including an organic compound with a hole transport property, a fourth vaporization source including a host material with a hole transport property, a fifth vaporization source including an organic compound with a light emission property, a sixth vaporization source including an organic compound with a blocking property, and a seventh vaporization source including an organic compound with an electron transport property.

By evaporating these organic compounds successively, a second organic compound layer can be formed on an anode, which is composed of functional regions having properties of hole injection, hole transport, light emission, blocking, and electron transport.

Herein, the case has been described in which, as a second organic compound layer, organic compounds with different functions are provided in seven vaporization sources, respectively, and these organic compounds are evaporated successively to form an organic compound layer. However, the present invention is not limited thereto. Any plural number of organic compounds may be used. As an organic compound for forming an organic compound layer emitting green light having the above-mentioned plurality of functions, known materials may be used.

The vaporization sources may be designed so as to control the film forming speed by a microcomputer. Furthermore, the vaporization sources may be designed so that a mixed ratio in the case of simultaneously forming a plurality of organic compounds into a film can be controlled.

The purifying chamber 813b is also provided with crucibles and heaters in the same way as in the purifying chamber 813a. Furthermore, in the present embodiment, crucibles for purifying seven organic compounds provided in vaporization sources are provided. As the purifying chamber 813b, the purifying chambers with the structures described in Embodiments 1 to 3 can be combined. Therefore, the detailed description thereof should be referred to Embodiments 1 to 3.

Reference numeral 808 denotes an alignment chamber. In this alignment chamber, alignment of a metal mask and placement of a substrate onto the metal mask are conducted for film formation in the subsequent film forming chamber. This alignment chamber is referred to as an alignment chamber (C) 808. The alignment chamber (C) 808 is provided with an exhaust system 800f. The alignment chamber (C) 808 is shut off by a gate (not shown) from the film forming chamber (B) 807.

Next, reference numeral 809 denotes a film forming chamber for forming a third organic compound layer by vapor deposition. This film forming chamber is referred to as a film forming chamber (C) 809. The film forming chamber (C) 809 is provided with an exhaust system 800g. The film forming chamber (C) 809 is shut off by a gate (not shown) from the alignment chamber (C) 808.

In the present embodiment, the film forming chamber with the structure shown in FIG. 6 is provided as the film forming chamber (C) 809, in which a third organic compound layer emitting blue light is formed into a film. In the same way as in FIG. 6, the film forming chamber (C) 809 is connected to a purifying chamber 813c via a gate.

As vaporization sources, there are provided a first vaporization source including an organic compound with a hole injection property, a second vaporization source including an organic compound with a light emission property, a third vaporization source including an organic compound with a blocking property, and a fourth vaporization source including an organic compound with an electron transport property.

By evaporating these organic compounds successively, a third organic compound layer can be formed on an anode, which is composed of functional regions having properties of hole injection, light emission, blocking, and electron transport.

In the present embodiment, at an interface between different functional regions, a mixed region is formed by simultaneously evaporating organic compounds for forming the functional regions. More specifically, a mixed region is formed at an interface between the hole injection region and the light emission region, an interface between the light emission region and the blocking region, and an interface between the blocking region and the electron transport region.

Herein, the case has been described in which, as a third organic compound layer, four kinds of organic compounds with different functions are provided in four vaporization sources, respectively, and these organic compounds are evaporated successively to form an organic compound layer. However, the present invention is not limited thereto. Any plural number of organic compounds may be used. Furthermore, the number of an organic compound to be provided in one vaporization source is not necessarily one, and a plurality of organic compounds may be provided in one vaporization source. For example, in addition to one kind of material provided as an organic compound with a light emission property in a vaporization source, another organic compound serving as a dopant may be provided. As an organic compound for forming an organic compound layer emitting blue light having the above-mentioned plurality of functions, known materials may be used.

The vaporization sources may be designed so as to control the film forming speed by a microcomputer. Furthermore, the vaporization sources may be designed so that a mixed ratio in the case of simultaneously forming a plurality of organic compounds into a film can be controlled.

The purifying chamber 813c is also provided with crucibles and heaters in the same way as in the purifying chamber 813a. Furthermore, in the present embodiment, crucibles for purifying four organic compounds provided in vaporization sources are provided. As the purifying chamber 813c, the purifying chambers with the structures described in Embodiments 1 to 3 can be combined. Therefore, the detailed description thereof should be referred to Embodiments 1 to 3.

In the present embodiment, the case has been described in which an organic compound layer emitting red light is formed in the film forming chamber (A) 803 that is a first film forming chamber, an organic compound layer emitting green light is formed in the film forming chamber (B) 807 that is a second film forming chamber, and an organic compound layer emitting blue light is formed in the film forming chamber (C) 809 that is a third film forming chamber. However, the order of formation of the films is not limited thereto. Either of the organic compound layer emitting red light, the organic compound layer emitting green light, and the organic compound layer emitting blue light only need to be formed in the film forming chamber (A) 803, the film forming chamber (B) 807, and the film forming chamber (C) 809. Furthermore, one more film forming chamber may be provided so that an organic compound layer emitting white light is formed.

Reference numeral 810 denotes a film forming chamber for forming a conductive film (a metal film serving as a cathode in the present embodiment) serving as an anode or a cathode of a light-emitting element by vapor deposition. This film forming chamber is referred to as a film forming chamber (D) 810. The film forming chamber (D) 810 is provided with an exhaust system 800h. The film forming chamber (D) 810 is shut off by a gate (not shown) from the film forming chamber (C) 809.

In the present embodiment, in the film forming chamber (D) 810, an Al—Li alloy film (alloy film of aluminum and lithium) is formed as a conductive film serving as a cathode of a light-emitting element by vapor deposition. It may also be possible that an element belonging to Group I or Group II of the periodic table and aluminum are subjected to codeposition.

In the film forming chamber (A) 803, the film forming chamber (B) 807, the film forming chamber (C) 809, and the film forming chamber (D) 810, a member for heating is provided respectively. With this structure, a part of an impurity in the film forming chambers can be removed.

As an exhaust pump provided in these film forming chambers, a dry pump, a mechanical booster pump, a turbo molecular pump (magnetic levitation type), a cryopump, or the like can be used. In the present embodiment, it is desirable to use both a cryopump and a dry pump.

The film forming chamber (A) 803, the film forming chamber (B) 807, the film forming chamber (C) 809, and the film forming chamber (D) 810 are decompressed by an exhaust pump. The vacuum degree attained at this time is desirably $10^{-6}$ Pa or more. For example, when a cryopump with an exhaust speed of 10000 l/s ($H_2O$) is used, and the inner surface area of a film forming chamber is 10 $m^2$, it is desirable that the inside of the film forming chamber is formed of a material such as aluminum with a leakage speed of $4.1 \times 10^{-7}$ Pa $m^3$ $s^{-1}$ or less in 20 hours. In order to obtain such a vacuum degree, it is effective to decrease the inner surface area of the film forming chamber by electropolishing.

A cleaning preliminary chamber may be provided to the treatment chambers such as the film forming chamber (A) 803, the film forming chamber (B) 807, the film forming chamber (C) 809, the film forming camber (D) 810, the alignment chamber (A) 802, the alignment chamber (B) 806, the alignment chamber (C) 808, and the purifying chambers (813a, 813b, 813c) via a gate. More specifically, radical is generated by decomposing a reactive gas such as $NF_3$ and $CF_4$ in the cleaning preliminary chamber, and the radical is introduced into the above-mentioned treatment chambers, whereby the insides of the treatment chambers can be cleaned.

Herein, by providing a CVD chamber, insulating films such as a silicon nitride film, a silicon oxide film, and a DLC film may be formed as protective films (passivation films) of a light-emitting element. In the case of providing the CVD chamber, a gas purifying apparatus may be provided for previously enhancing the purity of a material gas to be used in the CVD chamber.

Reference numeral 811 denotes a sealing chamber which is provided with an exhaust system 800i. The sealing chamber 811 is shut off by a gate (not shown) from the film forming chamber (D) 810. The sealing chamber 811 is in a vacuum state. When a plurality of substrates having light-emitting elements on which cathode has been formed so far are carried to the sealing chamber, a gate is closed, and the sealing chamber 811 is put into an atmospheric state by using an inert gas (nitrogen, helium, argon, etc.), whereby the light-emitting elements are sealed into a sealed space. The sealing chamber 811 is provided with a carrier mechanism (not shown), which carries a substrate from the film forming chamber (D) 810. The sealing treatment herein is conducted for the purpose of protecting a light-emitting element thus formed from oxygen and moisture. Specifically, the light-emitting element is mechanically sealed with a cover, or sealed with a thermosetting resin or a UV-curable resin.

The sealing chamber is previously provided with a cover. As the cover, glass, ceramics, plastic, or metal can be used. In the case where light is radiated to the cover side, the cover should be transparent. The cover and the substrate with the light-emitting element formed thereon are attached to each other with a sealant such as a thermosetting resin or a UV-curable resin, and the resin is cured by heat treatment or irradiation with UV-light to form a sealed space. It is also effective to provide a moisture-absorbing material such as barium oxide in the sealed space. The substrate with the light-emitting element formed thereon and the cover are attached to each other after alignment by an alignment mechanism connected to a CCD camera. Furthermore, a mechanism for automatically applying a sealing agent and a moisture-absorbing agent is also provided.

It is also possible that the space between the cover and the substrate with the light-emitting element formed thereon is filled with a thermosetting resin or a UV-curable resin. In this case, it is effective to add a moisture-absorbing material such as barium oxide in the thermosetting resin or the UV-curable resin.

In the film forming apparatus shown in FIG. 8, a mechanism (hereinafter, referred to as a "UV-light irradiation mechanism") for irradiating UV-light to the inside of the sealing chamber 811 is provided. The UV-curable resin is cured with UV-light emitted from the UV-light irradiation mechanism.

Finally, reference numeral 812 denotes an unload chamber, which is provided with an exhaust system 800j. A substrate with a light-emitting element formed thereon is taken out of the exhaust system 800j.

As described above, by using the film forming chamber shown in FIG. 8, a light-emitting element is not exposed to outside air until the light-emitting element is sealed in a sealed space. Therefore, it is possible to produce a highly reliable light-emitting apparatus.

Embodiment 5

Figure 9A:
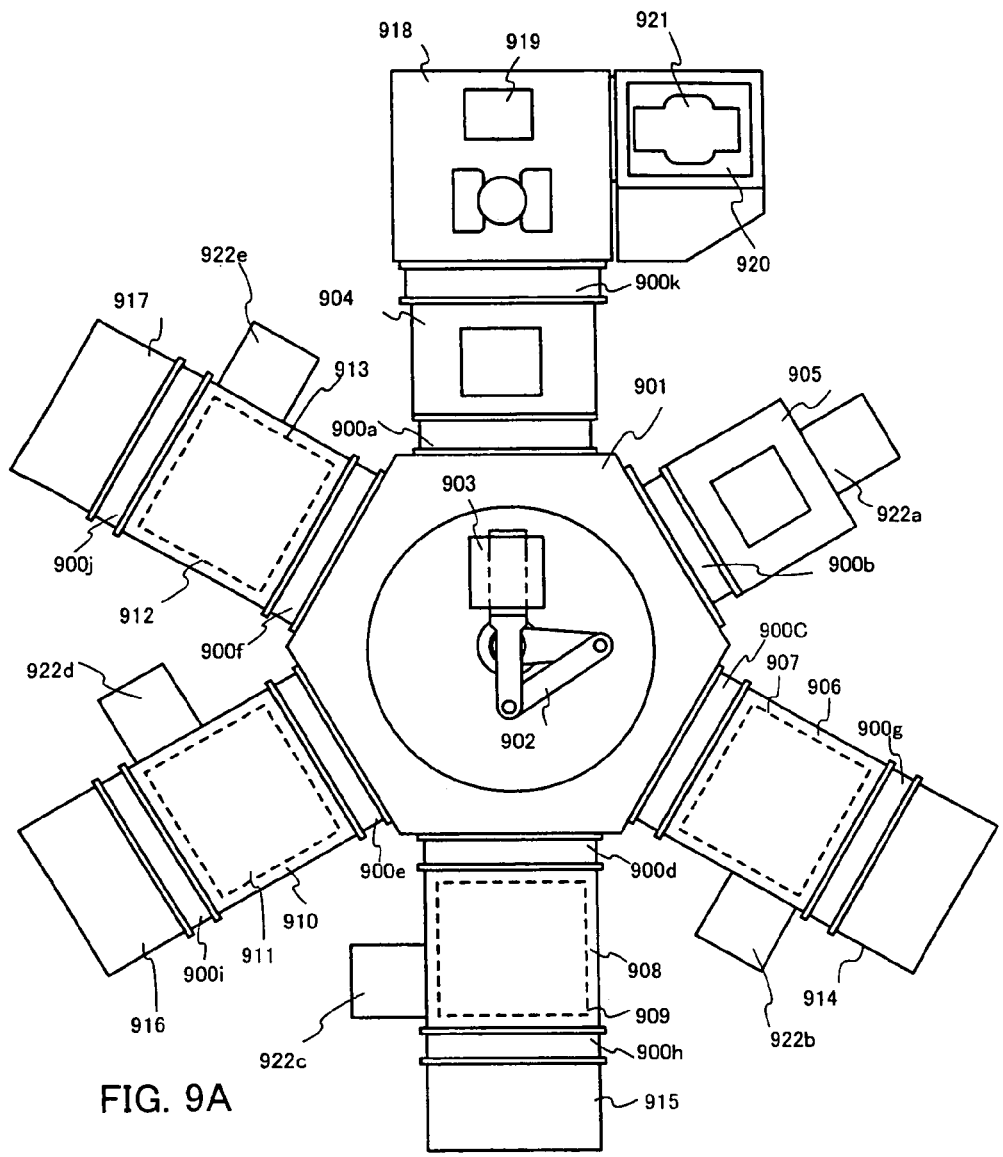
FIGS. 9A and 9B are drawings illustrating a purifying method.

A film formation apparatus of the present invention will be described using FIGS. 9A and 9B. In FIG. 9A, reference numeral 901 denotes a transfer chamber. A transfer mechanism (A) 902 is included in the transfer chamber 901 and transfers a substrate 903. The transfer chamber 901 is kept in a low pressure atmosphere and connected with respective processing chambers through gates. Transfer of the substrate to and from the respective processing chambers is performed by the transfer mechanism (A) 902 at the time when the gate is opened. When the pressure of the transfer chamber 901 is reduced, an exhaust pump such as a dry pump, a mechanical booster pump, a turbo molecular pump (magnetic levitation type), or a cryopump can be used. A cryopump that is excellent in removal of water and the like are desirably used together with a dry pump.

Hereinafter, the respective processing chambers will be described. Note that, since the transfer chamber 901 becomes in an atmosphere of reduced pressure, exhaust pumps (not shown) are provided in all processing chambers directly connected with the transfer chamber 901. A dry pump, a mechanical booster pump, a turbo molecular pump (magnetic levitation type), or a cryopump, which is described above, is used as the exhaust pump. Here, a cryopump is preferably used together with a dry pump.

Reference numeral 904 denotes a load chamber for setting (locating) a substrate. The load chamber 904 is connected with the transfer chamber 901 through a gate 900a and a carrier (not shown) in which the substrate 903 is set is located therein. Note that the load chamber 904 also serves as a transfer chamber for transferring the substrate in which formation of the element is completed to a sealing chamber. The load chamber 904 may include a substrate load room and a substrate unload room, which are separated from each other. In addition, the load chamber 904 includes the above exhaust pump and a purge line for introducing a nitrogen gas or a noble gas with high purity. A cryopump is desirable as the exhaust pump. Further, the purge line includes a gas purifying unit and thus impurities (oxygen and water) of the gas introduced into the apparatus are removed in advance.

Note that, a substrate on which a transparent conductive film as the anode of a light-emitting element has been formed is used as the substrate 903 in this embodiment. In this embodiment, the substrate 903 is set in the carrier so that a surface to be film-formed is located downward because a face down method (also referred to as a deposition up method) is easily performed in later film formation by an evaporation method. The face down method is a method of performing film formation in a state where the surface to be film-formed of the substrate is located downward. According to this method, for example, the adhesion of dust can be suppressed.

Next, reference numeral 905 denotes an alignment chamber for performing alignment of a metallic mask, and alignment between a substrate on which the anode or the cathode (anode in this embodiment) of a light-emitting element has been formed and the metallic mask. The alignment chamber 905 is connected with the transfer chamber 901 through a gate 900b. Note that the alignment of the metallic mask and the alignment between the substrate and the metallic mask are performed in the alignment chamber each time when a different organic compound layer is formed. Also, when a CCD (charge coupled device) known as an image sensor is provided in the alignment chamber 905, the alignment between the substrate and the metallic mask can be performed with high precision in film formation using the metallic mask.

Further, a cleaning auxiliary chamber 922a is connected with the alignment chamber 905. The cleaning auxiliary chamber 922a is constructed as shown in FIG. 9B. A μ-wave generator 931 for generating a μ-wave is provided and the μ-wave generated therein is transmitted to a plasma discharge tube 933 through a waveguide tube 932. Note that, μ-waves about 2.45 GHz are emitted from the μ-wave generator 931 used here. In addition, a reactive gas is supplied from a gas introduction tube 934 to the plasma discharge tube 933. Here, $NF_3$ is used as the reactive gas. Note that another reactive gas such as $CF_4$ or $ClF_3$ may be used.

Then, the reactive gas is decomposed by the μ-wave in the plasma discharge tube 933 to produce a radical. The radical is passed through the gas introduction tube 934 and introduced into the alignment chamber 905 connected therewith through a gate (not shown). Note that a reflecting plate 935 is preferably provided in the plasma discharge tube 933 in order to effectively supply the µ-wave.

Then, a metallic mask on which an organic compound layer is deposited is set in the alignment chamber 905. When a gate (not shown) provided between the cleaning auxiliary chamber 922a and the alignment chamber 905 is opened, the radical can be introduced into the alignment chamber 905. Thus, the metallic mask can be cleaned.

When the µ-wave plasma is used, the reactive gas can be made to be in a radical state with high efficiency. Thus, the probability of generating an impurity such as a by-product becomes lower. In addition, since this mechanism is different from the case of common radical generation, there is no case where the generated radical is accelerated. Further, since no radical is generated in the film formation chamber, damages to the inner portion of the film formation chamber and the metallic mask by plasma can be prevented.

Note that, since cleaning of the alignment chamber using such a method is one of preferred modes, the present invention is not limited to this method. Therefore, the reactive gas is introduced into the film formation chamber to produce plasma therein and thus dry cleaning may be performed. Further, an Ar gas or the like is introduced thereto and thus physical cleaning by a sputtering method may be performed.

Next, reference numeral 906 denotes a film formation chamber for forming an organic compound layer by an evaporation method, called a film formation chamber (A). The film formation chamber (A) 906 is connected with the transfer chamber 901 through a gate 900c. In this embodiment, a film formation chamber with the structure shown in FIGS. 6A and 6B is provided as the film formation chamber (A) 906.

In this embodiment, a first organic compound layer for light emission of red color is formed in a film formation portion 907 inside the film formation chamber (A) 906. The film formation chamber (A) 906 includes a plurality of evaporation sources, concretely, a first evaporation source including an organic compound with a hole injection property, a second evaporation source including an organic compound with a hole transport property, a third evaporation source including an organic compound with a hole transport property as a host of an organic compound with a light-emitting property, a fourth evaporation source including an organic compound with a light-emitting property, a fifth evaporation source including an organic compound with a blocking property, and a sixth evaporation source including an organic compound with an electron transport property.

When these organic compounds are vapor-deposited in order, the organic compound layer including regions with functions of the hole injection property, the hole transport property, the light-emitting property, the blocking property, and the electron transport property can be formed on the anode.

In addition, in this embodiment, in order to form a mixed region in an interface between different functional regions, both organic compounds for forming adjacent functional regions are simultaneously evaporated. That is, mixed regions are formed respectively in an interface between a hole injection region and a hole transport region, an interface between the hole transport region and a hole transport region including a light-emitting region, an interface between the hole transport region including the light-emitting region and a blocking region, and an interface between the blocking region and an electron transport region.

Note that the case where six kinds of different organic compounds are included in six evaporation sources respectively and these organic compounds are evaporated in order to form an organic compound layer as the first organic compound layer has been described above. However, the present invention is not limited to the above case and plural kinds of organic compounds are preferably used. In addition, one evaporation source does not necessarily include one kind of organic compound and may include plural kinds of organic compounds. For example, an evaporation source may include another organic compound, which is able to be a dopant, in addition to the one kind of material included as the organic compound with the light-emitting property. The organic compounds indicated in Embodiment 1 can be used as organic compounds for forming the organic compound layer, which has the plurality of functions and indicates light emission of red color. A free combination of known materials may be also used.

The film formation chamber (A) 906 is connected with a refining chamber 914 through a gate 900g. The refining chamber 914 is same as that explained in FIG. 6. Note that the refining chamber 914 is provided with a crucible for refining an organic compound and a heater for heating the crucible. In addition, a temperature from the heater being applied when refining is executed be 200 to 500° C.

In the refining chamber 914, the exhaust pump (not shown in the figure) is provided to reduce in pressure in inside. The degree of vacuum finally reaches $10^{-5}$ to $10^{-6}$ Pa in this embodiment. And, when it becomes the same pressure state as that within the film formation chamber, open the gate 900g to thereby enable the evaporation source within the film formation chamber to be furnished with a high purify organic compound by a transfer mechanism.

Further, the refining chamber 914 can be performed by combining the structure of the refining chamber described in Embodiments 1 to 3.

Note that, with respect to a film formation process in the film formation chamber (A) 906, the description of Embodiment 2 may be referred to.

Note that, a cleaning auxiliary chamber 922b is connected with the film formation chamber (A) 906 through a gate (not shown) as in the case of the alignment chamber 905. Specifically, the cleaning auxiliary chamber 922b has the same structure as the cleaning auxiliary chamber 922a. When a radical produced in the cleaning auxiliary chamber 922b is introduced into the film formation chamber (A) 906, the organic compound and the like which are deposited in the inner portion of the film formation chamber (A) 906 can be removed.

Next, reference numeral 908 denotes a film formation chamber for forming a second organic compound layer by an evaporation method, called a film formation chamber (B). The film formation chamber (B) 908 is connected with the transfer chamber 901 through a gate 900d. In this embodiment, a film formation chamber with the structure shown in FIGS. 6A and 6B is provided as the film formation chamber (B) 908. In this embodiment, an organic compound layer for light emission of green color is formed in a film formation portion 909 inside the film formation chamber (B) 908.

Inside the film formation chamber (B) 908 there are set a plurality of evaporation sources, specifically, a first evaporation source including an organic compound with a hole injection property, a second and a third evaporation sources including the organic compound with a hole transporting property, a fourth evaporation source including a host material of a hole transporting property, a fifth evaporation source including an organic compound with a light-emitting property, a sixth evaporation source including an organic compound with a blocking property, and a seventh evaporation source including an organic compound with an electron transporting property.

When these organic compounds are evaporated in order, the second organic compound layer comprising regions with functions of the hole injection property, the hole transporting property, the light-emitting property, the blocking property, and the electron transport property can be formed on the anode.

In addition, in this embodiment, in order to form a mixed region in an interface between different functional regions, both organic compounds for forming, adjacent functional regions are simultaneously evaporated. That is, mixed regions are formed respectively in an interface between a hole injection region and a hole transporting region, an interface between the hole transporting region and a hole transporting region including the light-emitting region, an interface between the transporting region including the light-emitting region and blocking region, and an interface between the blocking region and an electron transporting region.

Note that the case where seven kinds of organic compounds having different functions are included in seven evaporation sources, respectively, and these organic compounds are evaporated in order to form an organic compound layer as the second organic compound layer has been described above. However, the present invention is not limited to the above case, as far as plural kinds of organic compounds are used. In addition, one evaporation source does not necessarily include one kind of organic compound and may include plural kinds of organic compounds. For example, an evaporation source may include another organic compound, which is able to be a dopant in addition to one kind of material included as the organic compound with the light-emitting property. The organic compounds indicated in Embodiment 1 can be used as organic compounds for forming the organic compound layer, which has the above plurality of functions and indicates light emission of green color. A free combination of known materials may be also used.

The film formation chamber (B) 908 is connected with a refining chamber 915 through a gate 900h. The refining chamber 915 is same as that explained in FIG. 6. Note that the refining chamber 915 is provided with a crucible for refining an organic compound and a heater for heating the crucible. In addition, a temperature from the heater being applied when refining is executed be 200 to 500° C.

In the refining chamber 915, the exhaust pump (not shown in the figure) is provided to reduce in pressure in inside. The degree of vacuum finally reaches $10^{-5}$ to $10^{-6}$ Pa in this embodiment. Moreover, when it becomes the same pressure state as that within the film formation chamber, open the gate 900h to thereby enable the evaporation source within the film formation chamber to be furnished with a high purify organic compound by a transfer mechanism.

Further, the refining chamber 915 can be performed by combining the structure of the refining chamber described in Embodiments 1 to 3.

Note that, with respect to a film formation process in the film formation chamber (B) 908, the description of FIG. 6 may be referred to.

A cleaning auxiliary chamber 922c is connected with the film formation chamber (B) 908 through a gate (not shown) as in the case of the alignment chamber 905. Specifically, the cleaning auxiliary chamber 922c has the same structure as the cleaning auxiliary chamber 922a. When a radical produced in the cleaning auxiliary chamber 922c is introduced into the film formation chamber (B) 908, the organic compound and the like which are deposited inside the film formation chamber (B) 908 can be removed.

Next, reference numeral 910 denotes a film formation chamber for forming a second organic compound layer by an evaporation method, called a film formation chamber (C). The film formation chamber (C) 910 is connected with the transfer chamber 901 through a gate 900e. In this embodiment, a film formation chamber with the structure shown in FIGS. 2A and 2B is provided as the film formation chamber (C) 910. In this embodiment, an organic compound layer for light emission of blue color is formed in a film formation portion 911 inside the film formation chamber (C) 910.

Inside the film formation chamber (C) 910 there are set a plurality of evaporation sources, specifically, a first evaporation source including an organic compound with a hole injection property, a second evaporation source including the organic compound with a light-emitting property, a third evaporation source including an organic compound with a blocking property, and a fourth evaporation source including an organic compound with an electron transporting property.

When these organic compounds are evaporated in order, the organic compound layer comprising regions with functions of the hole injection property, the light-emitting property, the blocking property, and the electron transport property can be formed on the anode.

In addition, in this embodiment, in order to form a mixed region in an interface between different functional regions, both organic compounds for forming adjacent functional regions are simultaneously evaporated. That is, mixed regions are formed respectively in an interface between a hole injection region and light-emitting region, an interface between the light-emitting region and a blocking region, and an interface between the blocking region including the electron transporting.

Note that the case where four kinds of organic compounds having different functions are included in four evaporation sources, respectively, and these organic compounds are evaporated in order to form an organic compound layer as the third organic compound layer has been described above. However, the present invention is not limited to the above case, as far as plural kinds of organic compounds are used. In addition, one evaporation source does not necessarily include one kind of organic compound and may include plural kinds of organic compounds. For example, an evaporation source may include another organic compound, which is able to be a dopant in addition to one kind of material included as the organic compound with the light-emitting property. The organic compounds indicated in Embodiment 1 can be used as organic compounds for forming the organic compound layer, which has the above plurality of functions and indicates light emission of blue color. A free combination of known materials may be also used.

The film formation chamber (C) 910 is connected with a refining chamber 916 through a gate 900i. Note that the refining chamber 916 is provided with a crucible for refining an organic compound and a heater for heating the crucible. In addition, a temperature from the heater being applied when refining is executed be 200 to 500° C.

In the refining chamber 916, the exhaust pump (not shown in the figure) is provided to reduce in pressure in inside. The degree of vacuum finally reaches $10^{-5}$ to $10^{-6}$ Pa in this embodiment. In addition, when it becomes the same pressure state as that within the film formation chamber, open the gate 900i to thereby enable the evaporation source within the film formation chamber to be furnished with a high purify organic compound by a transfer mechanism.

Further, the refining chamber 916 can be performed by combining the structure of the refining chamber described in Embodiments 1 to 3.

Note that, with respect to a film formation process in the film formation chamber (C) 910, the description of FIG. 6 may be referred to.

A cleaning auxiliary chamber 922d is connected with the film formation chamber (C) 910 through a gate (not shown) as in the case of the alignment chamber 905. Specifically, this chamber has the same structure as the cleaning auxiliary chamber 922a. When a radical produced in the cleaning auxiliary chamber 922d is introduced into the film formation chamber (C) 910, the organic compound and the like which are deposited inside the film formation chamber (C) 910 can be removed.

Next, reference numeral 912 denotes a film formation chamber for forming a conductive film (metallic film as the cathode in this embodiment) as the anode or the cathode of a light-emitting element by an evaporation method. This is called a film formation chamber (D). The film formation chamber (D) 912 is connected with the transfer chamber 901 through a gate 900f. In this embodiment, an Al—Li alloy film (alloy film of aluminum and lithium) is formed as a conductive film, which is to be the cathode of the light-emitting element, in the film formation portion 913 of the film formation chamber (D) 912. Note that an element belonging to group 1 or group 2 of the periodic table and aluminum may be evaporated together. The coevaporation is made by an evaporation method of simultaneously heating evaporation sources to mix different materials in a film formation stage.

The film formation chamber (D) 912 is connected with a material exchange chamber 917 through a gate 900j. Note that a heater for heating exchanged conductive materials is provided in the material exchange chamber 917. When the conductive materials are heated in advance, an impurity such as water can be removed. A heating temperature at this time is preferably 200° C. or lower. In addition, an exhaust pump capable of making the inner portion be in a reduced pressure state is included in the material exchange chamber 917. Thus, after conductive materials are introduced from the outside, the inner portion is made to be in a reduced pressure state. Then, when the material exchange chamber becomes the same pressure state as the inside of the film formation chamber, the gate 900j is opened. Therefore, the conductive materials can be set in the evaporation sources inside the film formation chamber.

A cleaning auxiliary chamber 922e is connected with the refining chamber (D) 912 through a gate (not shown) as in the case of the alignment chamber 905. Concretely, the cleaning auxiliary chamber 922e has the same structure as the cleaning auxiliary chamber 922a. When a radical produced in the cleaning auxiliary chamber 922e is introduced into the film formation chamber (D) 912, the conductive material and the like which are deposited inside the film formation chamber (D) 912 can be removed.

In the film formation chamber (A) 906, the film formation chamber (B) 908, the film formation chamber (C) 910, and the film formation chamber (D) 912, mechanisms for heating the inner portions of the respective film formation chambers are provided. Thus, an impurity such as water in the film formation chambers can be removed.

As an exhaust pump included in the above respective film formation chambers, a dry pump, a mechanical booster pump, a turbo molecular pump (magnetic levitation type), a cryopump, or the like can be used. In this embodiment, a cryopump and a dry pump are desirably used.

A pressure in each of the film formation chamber (A) 906, the film formation chamber (B) 908, the film formation chamber (C) 910, and the film formation chamber (D) 912 are reduced by exhaust pumps. At this time, the degree of vacuum to be reached is desirably $10^{-6}$ Pa or more. For example, when a cryopump with an exhaust rate of 36000 l/s ($H_2O$) is used and a surface area of the inner portion of the film formation chamber is 1.5 $m^2$, the inner portion of the film formation chamber is preferably made of a material such as 18-8 stainless steel with a leak rate of $9.3 \times 10^{-7}$ $Pa \cdot m^3 \cdot s^{-1}$ or less. In order to obtain such a degree of vacuum, it is effective that the surface area of the inner portion of the film formation chamber is reduced by electropolishing because absorption of an impurity such as oxygen or water can be decreased.

In addition, a material such as aluminum which is mirror-finished by electropolishing is used for the inner wall surface. In addition, an inner member made of a material such as ceramics which is processed so as to extremely have fewer pores is used. These materials have a surface evenness that an average surface roughness is 5 nm or less (preferably, 3 nm or less). The average surface roughness as described here is a roughness that a center line average roughness as defined by JIS B0601 is three-dimensionally extended for application to a surface.

In addition, there is also a method of forming an active surface on the inner wall of the film formation chamber using a material which is easy to react with a gas. Ti, Zr, Nb, Ta, Cr, Mo, W, La, Ba, or the like may be used as a material in this case.

Next, reference numeral 918 denotes a sealing chamber (also referred to as a filling chamber or a glove box), which is connected with the load chamber 904 through a gate 900k. In the sealing chamber 918, processing for finally enclosing the light-emitting element in a hermetic space is performed. This processing is for protecting the formed light-emitting element from oxygen and moisture. Thus, means of performing mechanical sealing using a cover member, or sealing using a heat curable resin or an ultraviolet light curable resin is used.

Glass, ceramics, plastic, or metal can be used for the cover member. However, when light is emitted to the cover member side, it is required that the cover member be transparent. The cover member is bonded to the substrate on which the above light-emitting element is formed by using a seal agent made of heat curable resin, ultraviolet light curable resin, or the like and then the resin is cured by thermal treatment or ultraviolet light irradiation processing to produce the hermetic space. It is also effective to provide a moisture absorption agent represented by barium oxide in the hermetic space.

A space between the cover member and the substrate on which the light-emitting element is formed can be filled with heat curable resin or ultraviolet light curable resin. In this case, it is effective to add a moisture absorption agent represented by barium oxide into heat curable resin or ultraviolet light curable resin.

In the film formation apparatus shown in FIGS. 9A and 9B, a mechanism 919 for irradiating ultraviolet light into the inner portion of the sealing chamber 918 (hereinafter referred to as an ultraviolet light irradiation mechanism) is provided and ultraviolet light curable resin is cured with ultraviolet light emitted from the ultraviolet light irradiation mechanism 919. Further, the inner portion of the sealing chamber 918 can be made to be in a reduced pressure state by attaching an exhaust pump. When the above sealing step is mechanically performed by robot operation under a reduced pressure state, mixing of oxygen and moisture can be prevented. Note that, specifically, the concentration of oxygen and water is desirably 0.3 ppm or lower. On the other hand, the inner portion of the sealing chamber 918 can be made to be in a pressurized state. In this case, purging is performed using a nitrogen gas or a noble gas with high purity to make a pressurized state. Thus, intrusion of oxygen and the like from the outside are prevented.

Next, a passing chamber (pass box) 920 is connected with the sealing chamber 918. A transfer mechanism (B) 921 is provided in the passing chamber 920 and the substrate in which sealing of the light-emitting element is completed in the sealing chamber 918 is transferred to the passing chamber 920. The passing chamber 920 can be also made to be in a reduced pressure state by attaching an exhaust pump. The passing chamber 920 is a facility in order not to directly expose the sealing chamber 918 to outside air and the substrate is taken out therefrom. In addition, a member supply chamber (not shown) for supplying a member used in the sealing chamber can be provided.

Note that, although not shown in this embodiment, after formation of the light-emitting element, a compound containing silicon such as silicon nitride or silicon oxide, or an insulating film in which a DLC (diamond like carbon) film containing carbon is laminated on the above compound may be formed on the light-emitting element. The DLC (diamond like carbon) film is an amorphous film in which diamond bond ($sp^3$ bond) and graphite bond ($SP^2$ bond) are mixed. In this case, a film formation chamber including a CVD (chemical vapor deposition) apparatus, in which a self bias is applied to generate plasma and to form a thin film by plasma discharge decomposition of a raw material gas, is preferably provided.

Note that oxygen ($O_2$), hydrogen ($H_2$), methane ($CH_4$), ammonia ($NH_3$), or silane ($SiH_4$) can be used in the film formation chamber including the CVD (chemical vapor deposition) apparatus. In addition, a CVD apparatus which has parallel plate electrodes and an RF power source of 13.56 MHz is preferably used.

Further, a film formation chamber for performing film formation by a sputtering method (also referred to as a sputter method) can be provided since film formation by sputtering is effective in the case where the anode is formed after the organic compound layer is formed on the cathode of the light-emitting element. That is, it is effective in the case where a pixel electrode is the cathode. Note that, when the inner portion of the film formation chamber at film formation is made to be in an atmosphere in which oxygen is added into argon, an oxygen concentration in a formed film can be controlled and thus a film having a high transmittance and a low resistance can be formed. In addition, as in the case of other film formation chambers, the film formation chamber is desirably isolated from the transfer chamber by the gate.

In the film formation chamber for performing sputtering, a mechanism for controlling a temperature of a substrate on which a film is to be formed may be provided. The substrate is desirably kept at 20 to 150° C. As an exhaust pump included in the film formation chamber, a dry pump, a mechanical booster pump, a turbo molecular pump (magnetic levitation type), a cryopump, or the like can be used. In this embodiment, the cryopump and the dry pump are desirable.

Figure 9B:
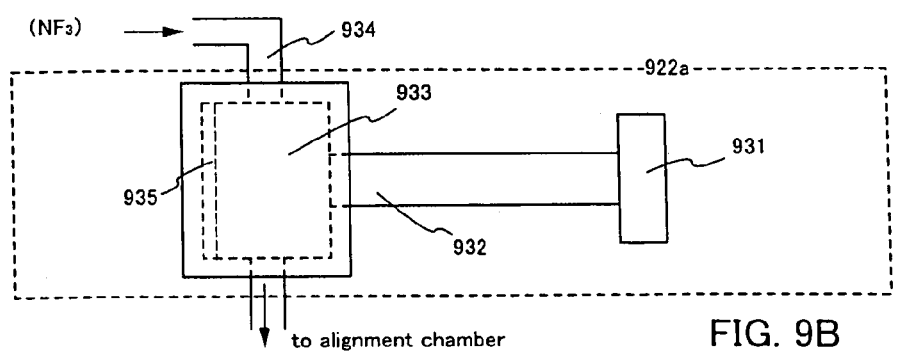
Figure 10:
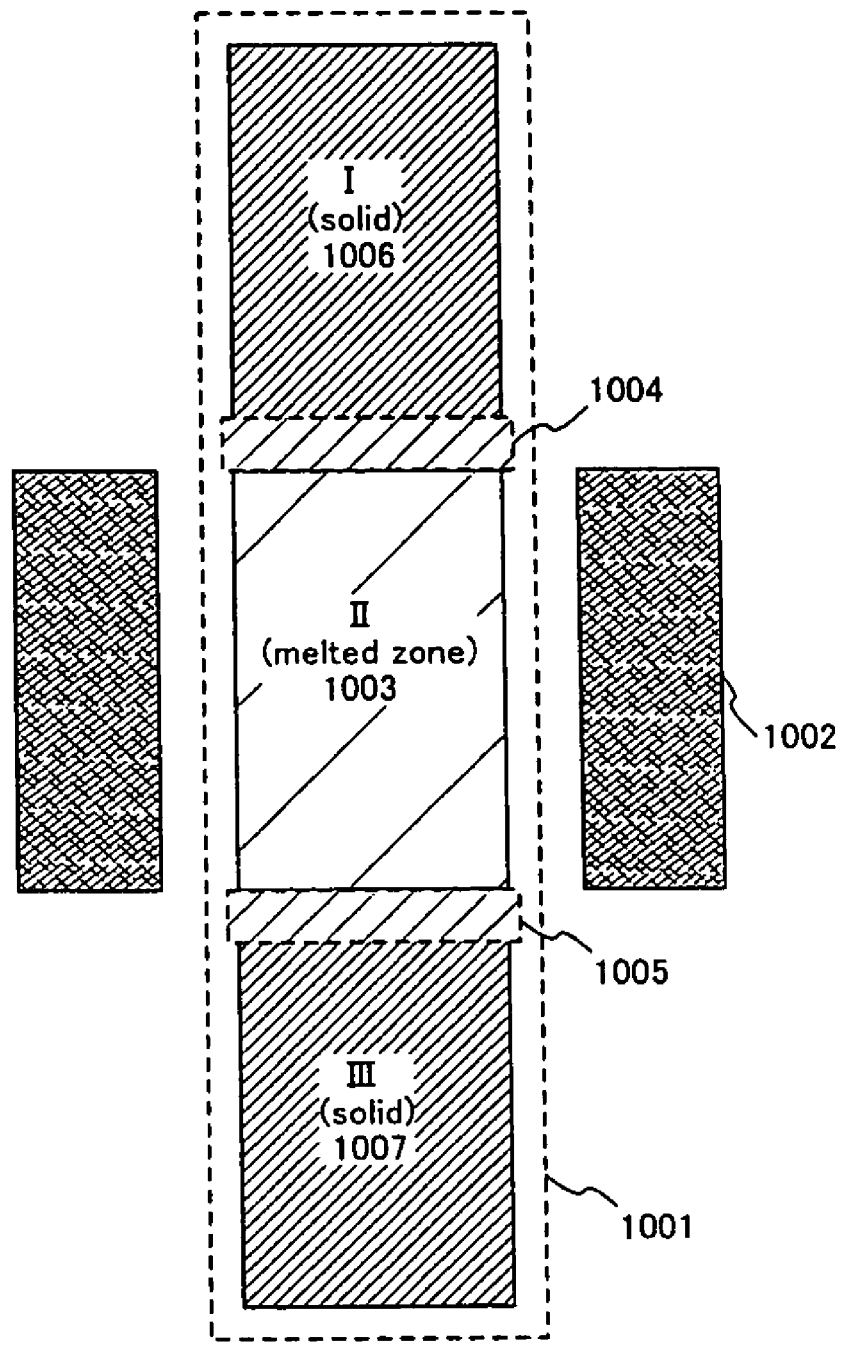
FIG. 10 is a drawing illustrating a conventional example.
Figure 11A:
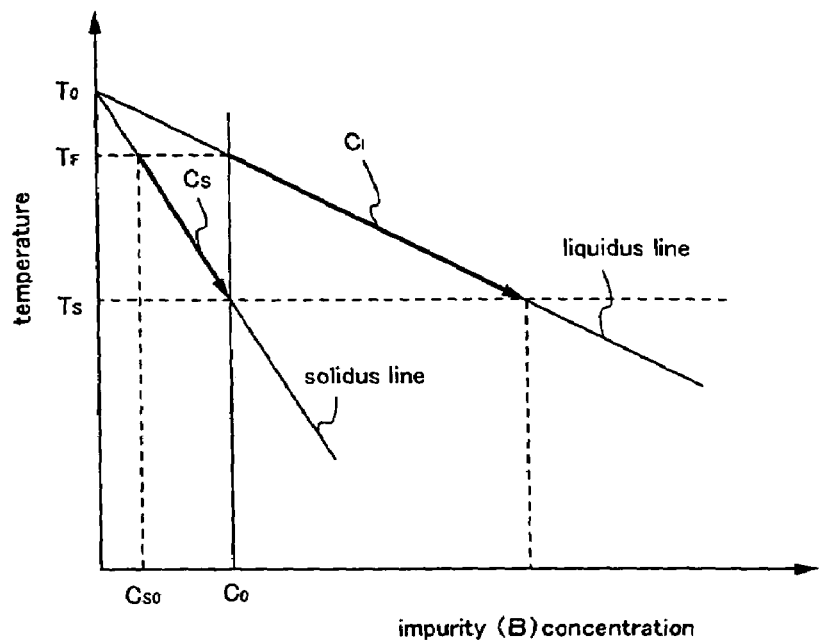
FIGS. 11A and 11B are drawings illustrating a conventional example.
Figure 11B:
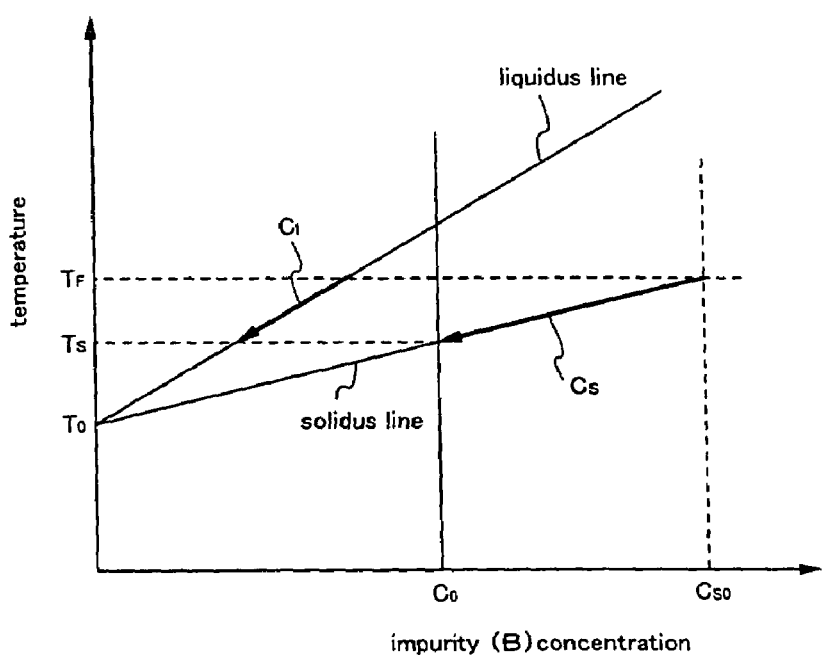

As described above, when the film formation apparatus shown in FIGS. 9A and 9B is used, the light-emitting element is completely enclosed in the hermetic space without exposure to outside air. Thus, a light-emitting device having high reliability can be manufactured.

By using the film forming apparatus of the present invention, a thin film can be formed of a highly purified organic compound. Furthermore, by providing the function of preventing contamination with an impurity in the film forming apparatus, a film can be formed without being contaminated with an impurity during film formation. Therefore, the effect of preventing a light-emitting element from being degraded due to the mixture of an impurity in an organic compound layer can be enhanced, which prolongs the life of the element.

Various other modifications will be apparent to and can be readily made by those skilled in the art without departing from the scope and spirit of this invention. Accordingly, it is not intended that the scope of the claims appended hereto be limited to the description as set forth herein, but rather that the claims be broadly construed.

What is claimed is:

1. A film forming apparatus comprising:
a film forming chamber comprising a substrate holder;
a purifying chamber,
wherein the film forming chamber comprises a vaporization source,
wherein the purifying chamber comprises a plurality of containers, a heater, and a carrier mechanism,
wherein the plurality of containers are stacked on each other,
wherein the heater comprises moving means and heating means for heating the containers at the time of movement of the heater, and
wherein the carrier mechanism comprises carrying means for carrying only a container containing a highly purified organic compound among the plurality of containers from the purifying chamber to the film forming chamber.

2. A film forming apparatus according to claim 1, wherein the heater comprises the moving means for moving in a longitudinal direction of the container.

3. A film forming apparatus according to claim 1, wherein the heater moves at a speed of $10^{-2}$ to 10 cm/h.

4. A film forming apparatus according to claim 1, wherein the plurality of containers have a structure in which a plurality of containers each having an opening at a bottom are stacked on a container having a bottom portion.

5. A film forming apparatus according to claim 1, wherein at least one of the plurality of containers includes an organic compound in a solid state at room temperature under normal atmospheric pressure.

6. A film forming apparatus according to claim 1, wherein at least one of the plurality of containers is provided with a plurality of the heaters.

7. A film forming apparatus according to claim 1, wherein at least one of the plurality of containers comprises a crucible.

* * * * *